(12) United States Patent
Nishio et al.

(10) Patent No.: US 12,278,601 B2
(45) Date of Patent: Apr. 15, 2025

(54) POWER AMPLIFIER SEMICONDUCTOR DEVICE

(71) Applicant: Nuvoton Technology Corporation Japan, Kyoto (JP)

(72) Inventors: Akihiko Nishio, Ishikawa (JP); Katsuhiko Kawashima, Hyogo (JP); Yusuke Kanda, Toyama (JP); Takashi Yui, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/895,976

(22) Filed: Sep. 25, 2024

(65) Prior Publication Data

US 2025/0015768 A1    Jan. 9, 2025

Related U.S. Application Data

(63) Continuation of application No. PCT/JP2023/006448, filed on Feb. 22, 2023.
(Continued)

(51) Int. Cl.
*H03F 3/195* (2006.01)
*H01L 23/66* (2006.01)
(Continued)

(52) U.S. Cl.
CPC .............. *H03F 3/21* (2013.01); *H01L 23/66* (2013.01); *H03F 3/195* (2013.01);
(Continued)

(58) Field of Classification Search
CPC ...................................................... H03F 3/195
(Continued)

(56) References Cited

U.S. PATENT DOCUMENTS

| 4,982,247 A | 1/1991 | Aoki |
|---|---|---|
| 2004/0095501 A1 | 5/2004 | Aizawa et al. |

(Continued)

FOREIGN PATENT DOCUMENTS

| JP | S60-231370 A | 11/1985 |
|---|---|---|
| JP | 2004-260082 A | 9/2004 |

(Continued)

OTHER PUBLICATIONS

International Search Report dated May 16, 2023 issued in International Patent Application No. PCT/JP2023/006448, with English translation.

(Continued)

*Primary Examiner* — Henry Choe
(74) *Attorney, Agent, or Firm* — Rimon P.C.

(57) ABSTRACT

A power amplifier semiconductor device includes: a substrate; a semiconductor layer provided on the surface of the substrate and including a plurality of unit HEMTs; a connection layer provided on the semiconductor layer and including a source electrode, a drain electrode, and a gate electrode of each of the plurality of unit HEMTs; a terminal layer provided on the connection layer; a back electrode which is provided on the bottom surface of the substrate and whose potential is set to a source potential; and substrate vias that pass through the substrate and have a shield wiring layer on inner walls of the substrate vias. In plan view, either one of the drain aggregation portion or the gate aggregation portion is or both of the drain aggregation portion and the gate aggregation portion are each surrounded by the substrate vias.

20 Claims, 26 Drawing Sheets

Related U.S. Application Data

(60) Provisional application No. 63/324,957, filed on Mar. 29, 2022.

(51) Int. Cl.
*H03F 3/21* (2006.01)
*H10D 30/01* (2025.01)
*H10D 30/47* (2025.01)
*H10D 64/00* (2025.01)
*H10D 64/27* (2025.01)

(52) U.S. Cl.
CPC ......... *H10D 30/015* (2025.01); *H10D 30/475* (2025.01); *H10D 64/111* (2025.01); *H10D 64/411* (2025.01); *H01L 2223/6616* (2013.01)

(58) Field of Classification Search
USPC ........................................................ 330/307
See application file for complete search history.

(56) References Cited

U.S. PATENT DOCUMENTS

| | | |
|---|---|---|
| 2008/0210989 A1 | 9/2008 | Naito |
| 2011/0133295 A1 | 6/2011 | Fujii et al. |
| 2018/0138132 A1 | 5/2018 | Nishizawa et al. |

FOREIGN PATENT DOCUMENTS

| | | |
|---|---|---|
| JP | 2008-182158 A | 8/2008 |
| JP | 2009-239115 A | 10/2009 |
| JP | 2011-139018 A | 7/2011 |
| WO | 2009/101870 A1 | 8/2009 |
| WO | 2017/029822 A1 | 2/2017 |

OTHER PUBLICATIONS

Jun Nagayama (Connectec Japan), "Semiconductor Packaging, Aiming for 30° C. Flip Chip Bonding", EE Times Japan, Published at 9:30 on Jun. 3, 2019, [URL] https://eetimes.itmedia.co.jp/ee/articles/1906/03/news019.html, with its partial English translation.

Decision to Grant a Patent dated Oct. 8, 2024 issued in the corresponding Japanese Patent Application No. 2024-511457, with English translation.

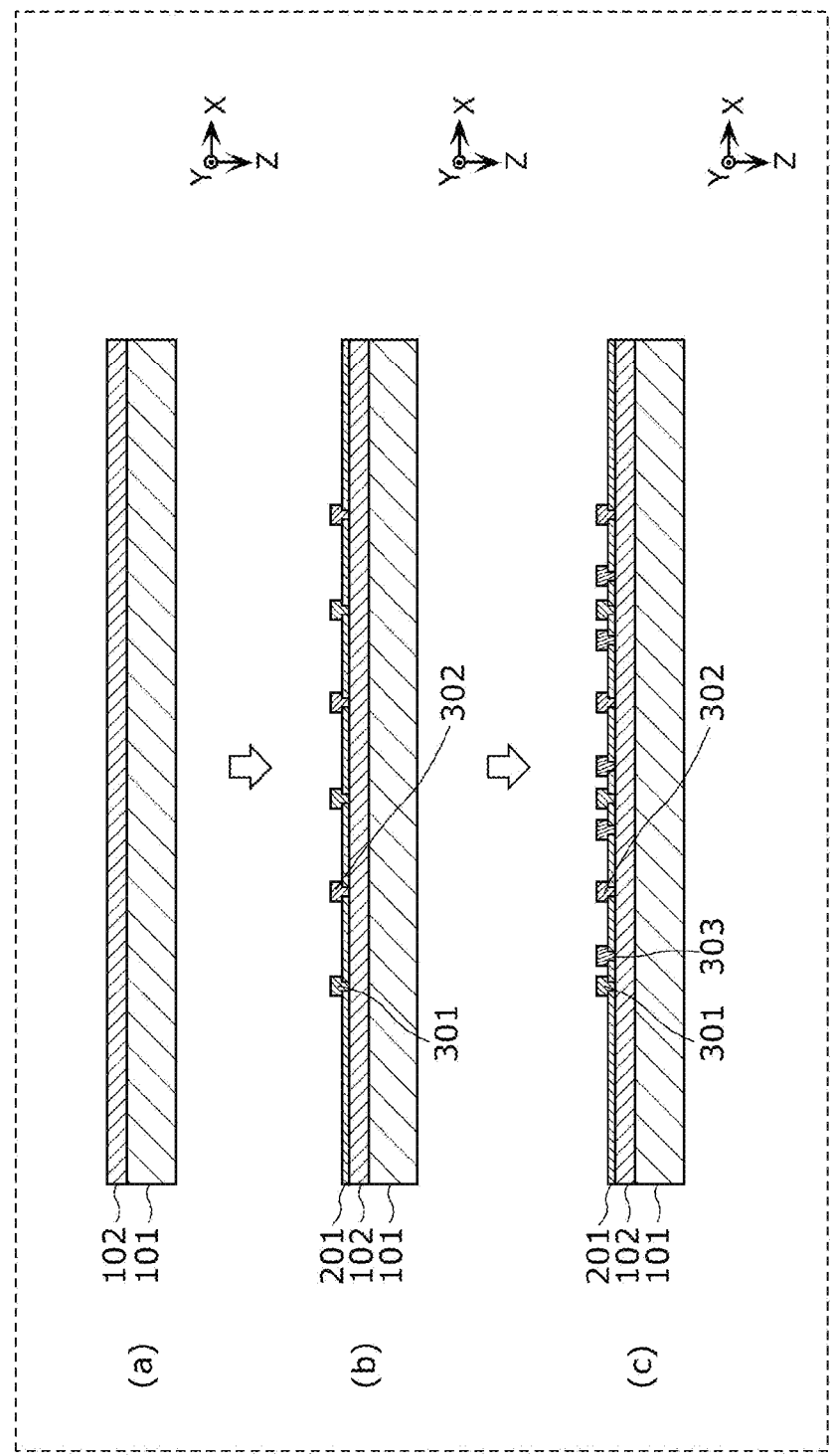

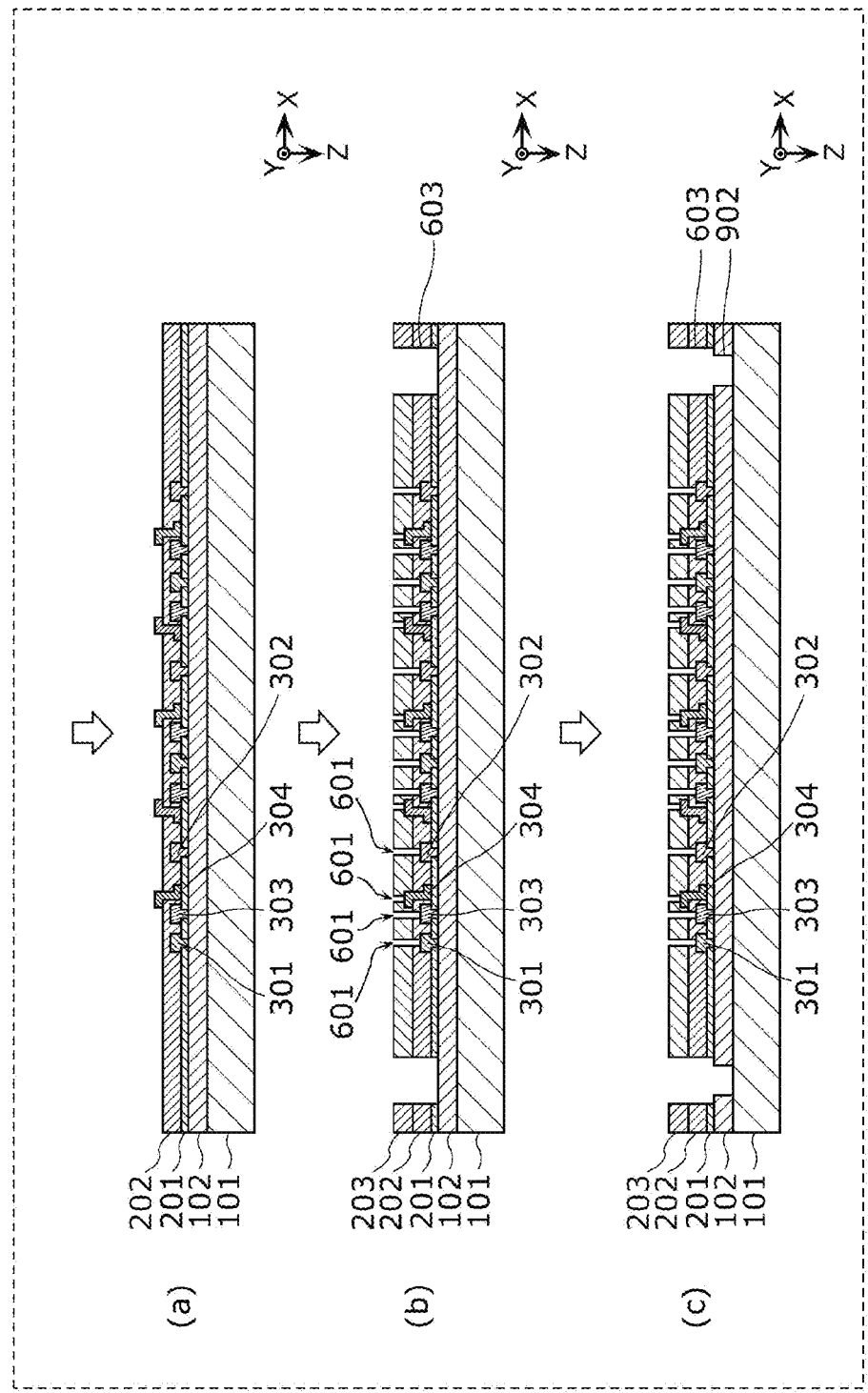

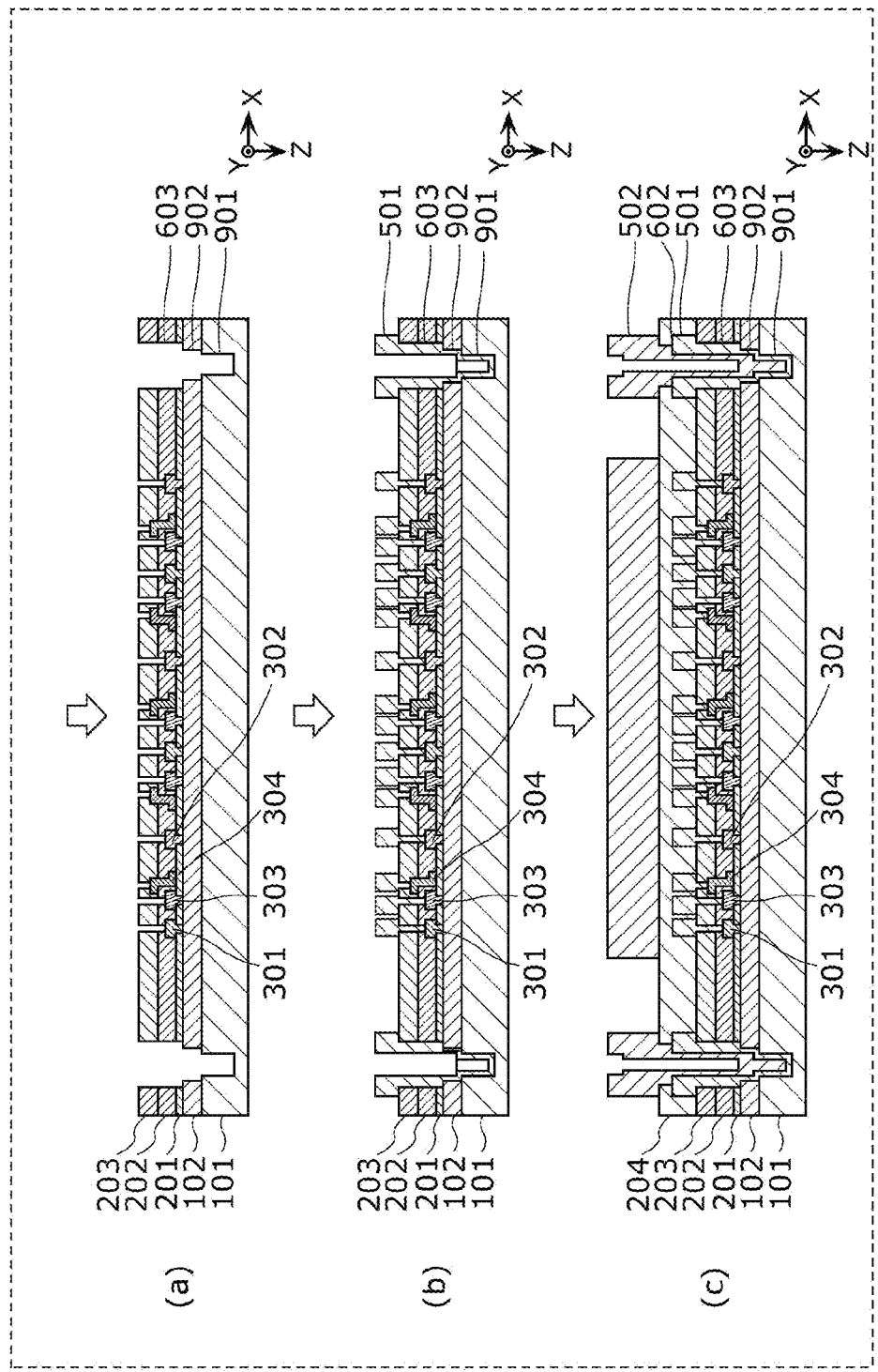

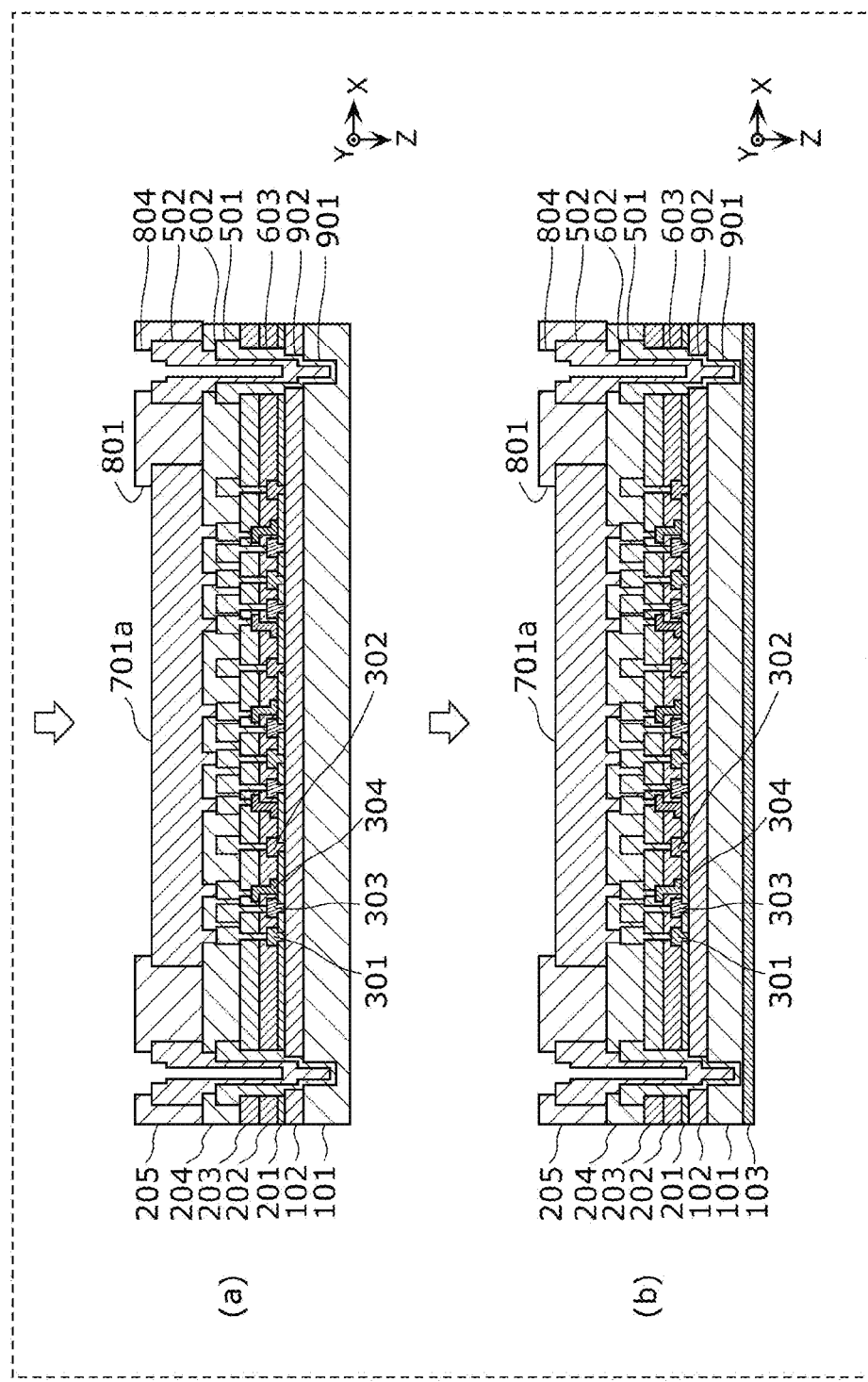

POWER AMPLIFIER SEMICONDUCTOR DEVICE

CROSS REFERENCE TO RELATED APPLICATIONS

This is a continuation application of PCT International Application No. PCT/JP2023/006448 filed on Feb. 22, 2023, designating the United States of America, which is based on and claims priority of U.S. Provisional Patent Application No. 63/324,957 filed on Mar. 29, 2022. The entire disclosures of the above-identified applications, including the specifications, drawings and claims are incorporated herein by reference in their entirety.

FIELD

The present disclosure relates to power amplifier semiconductor devices.

BACKGROUND

A hetero structure such as AlGaAs/GaAs or AlGaN/GaN can be easily formed in a III-V group semiconductor, and particularly in arsenic GaAs or AlGaAs and nitride GaN or AlGaN. In the case of the III-V group semiconductor, a high-mobility and high-density electron channel (two-dimensional electron gas (2DEG)) can be generated on the GaAs side of AlGaAs/GaAs or the GaN layer side of the AlGaN/GaN interface owing to spontaneous polarization caused by a difference in ion radius in addition to a band gap difference, or owing to a fixed charge due to piezo polarization caused by a difference in lattice constant between AlGaN and GaN. By controlling such a 2DEG channel, a high electron mobility transistor (HEMT) can be formed. Wide application of III-V group semiconductors as high-frequency devices such as amplifiers and switching elements has been spread, making use of high-speed operation owing to such high mobility.

In recent years, implementation of power amplifier semiconductor devices as high-frequency amplifiers intended for cell phone base stations has advanced, and a further rise in operation frequency as well as enhancement of output power are expected along with the advancement of a cell phone communication generation. Enhancing flexibility in chip mounting under a higher-frequency environment and achieving multi-functions of a high-frequency amplifier by flip-chip mounting such a semiconductor device are expected.

However, a rise in operation frequency and enhancement of output power lead to an increase in noise signal generated from a device itself used as a high-frequency amplifier. Various attempts are therefore made to suppress an influence caused by a noise signal.

CITATION LIST

Patent Literature

PTL 1: Japanese Unexamined Patent Application Publication No. 2004-260082

SUMMARY

Technical Problem

Unfortunately, with the conventional techniques disclosed in PTL 1, only countermeasures for a noise signal generated from electrode pads of a chip are taken, and there is still a room for improvement for suppressing an influence caused by a noise signal.

In view of this, the present disclosure provides a power amplifier semiconductor device that is more capable of suppressing an influence caused by a noise signal, compared with a conventional power amplifier semiconductor device.

Solution to Problem

A power amplifier semiconductor device according to the present disclosure is a power amplifier semiconductor device in which a plurality of unit high electron mobility transistors (HEMTs) are connected in parallel and which operates at the frequency of at least 3 GHZ, and includes: a substrate; a semiconductor layer provided on the surface of the substrate and including the plurality of unit HEMTs; a connection layer provided on the semiconductor layer and including a source electrode, a drain electrode, and a gate electrode of each of the plurality of unit HEMTs; a terminal layer provided on the connection layer and including a source pad, a drain pad, and a gate pad respectively connected to the source electrode, the drain electrode, and the gate electrode of each of the plurality of unit HEMTs via a first portion of a wiring layer; a back electrode which is provided on the bottom surface of the substrate and whose potential is set to a source potential equal to the potential of the source electrode; and substrate vias that pass through the substrate and have a shield wiring layer on inner walls of the substrate vias, where the shield wiring layer is a second portion of the wiring layer whose potential is set to the source potential. Each of the drain electrode and the gate electrode comprises drain electrodes and gate electrodes, respectively, corresponding to the plurality of unit HEMTs. The power amplifier semiconductor device further includes: a drain aggregation portion in which the drain electrodes are collectively connected by wires in a third portion of the wiring layer; and a gate aggregation portion in which the gate electrodes are collectively connected by wires in a fourth portion of the wiring layer. In a plan view of the substrate, either one of the drain aggregation portion or the gate aggregation portion is or both of the drain aggregation portion and the gate aggregation portion are each surrounded by the substrate vias.

Advantageous Effects

According to one aspect of the present disclosure, a power amplifier semiconductor device that is more capable, compared with a conventional power amplifier semiconductor device, of suppressing an influence caused by a noise signal can be achieved.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 20A is a first cross-sectional view for illustrating the manufacturing method of the power amplifier semiconductor device according to Embodiment 1.

FIG. 20B is a second cross-sectional view for illustrating the manufacturing method of the power amplifier semiconductor device according to Embodiment 1.

FIG. 20C is a third cross-sectional view for illustrating the manufacturing method of the power amplifier semiconductor device according to Embodiment 1.

FIG. 20D is a fourth cross-sectional view for illustrating the manufacturing method of the power amplifier semiconductor device according to Embodiment 1.

DESCRIPTION OF EMBODIMENTS

Figure 1:
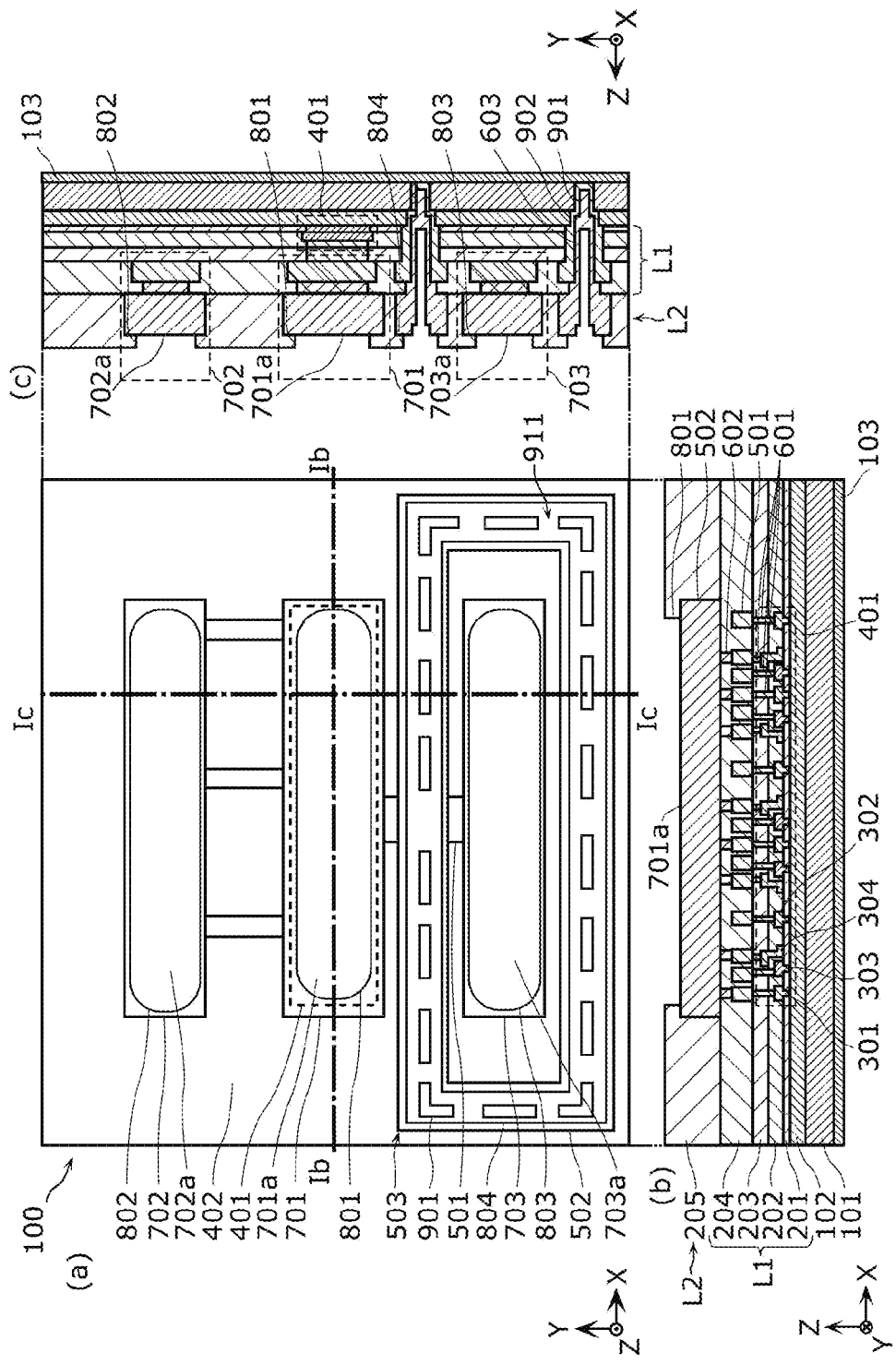
FIG. 1 is a diagram illustrating the configuration of a power amplifier semiconductor device according to Embodiment 1.

The present disclosure relates to a power amplifier semiconductor device and a chip structure capable of suppressing noise influence from outside, self-oscillation within a chip, and noise influence on the surrounding chips particularly in a flip-chip mounted semiconductor device.

As described in the "Background", a rise in operation frequency and enhancement of output power lead to an increase in noise signal generated from a device itself used as a high-frequency amplifier. A noise signal generated from a device in operation may affect the surrounding components and cause a problem such as self-oscillation, and suppression of a noise signal is indispensable for a flip-chip mounted high-frequency amplifier. The techniques described in PTL 1 disclose no countermeasures for an influence on the surrounding components caused by a noise signal generated from the side face of the chip. In addition, with the techniques described in PTL 1, countermeasures are insufficient in terms of avoidance of a noise signal received from the surrounding components.

In view of this, the present disclosure provides a power amplifier semiconductor device that can achieve both suppression of noise generated from a transistor itself and avoidance (suppression) of an influence caused by noise from external components, by covering the active region of the transistor and the surrounding of each terminal by a bump, a substrate via structure, and a back electrode, using a ground potential.

Hereinafter, embodiments of the present disclosure will be described with reference to the drawings. The embodiments described below each illustrate one preferred specific example of the present disclosure. The numerical values, shapes, materials, elements, the arrangement positions and connections of the elements, steps (processes), order of the steps (processes), etc., shown in the following embodiments are mere examples, and therefore do not intend to limit the present disclosure. Among elements in the following embodiments, elements not described in independent claims reciting the broadest concept of the present disclosure are illustrated as optional elements.

The figures are schematic diagrams and are not necessarily precise illustrations. Accordingly, the figures are not necessarily to scale. Elements that are essentially the same share like reference signs in the figures, and duplicate description is omitted or simplified.

In this specification and the drawings, an X-axis, a Y-axis, and a Z-axis indicate three axes in a right-handed threedimensional orthogonal coordinate system. In each of the embodiments, the Z-axis direction is the stacking direction of layers in a power amplifier semiconductor device. In the specification, the expression "in plan view" means that a power amplifier semiconductor device is viewed along the stacking direction (the Z-axis direction) of the power amplifier semiconductor device.

In the specification, terms, such as "parallel" and "orthogonal", indicating relationships between elements and terms, such as "rectangular", indicating the shape of an element, as well as numerical values and the range of numerical values are each an expression that presents not only its strict meaning but include also a substantially same range, e.g., a difference of approximately few percent (or approximately ten percent).

In the specification, the terms "on (e.g., on a substrate)", "above", and "below" do not indicate an upper direction (vertically upward) and a lower direction (vertically downward) in absolute space recognition, but are used as terms defined by relative positional relationships based on a stacking order in a stacking structure. The terms "on (e.g., on a substrate)", "above", and "below" are used not only in a case where two elements are disposed apart from each other and other elements are present between the two elements, but also in a case where two elements are disposed in contact with each other.

Embodiment 1

[1-1. Configuration of Power Amplifier Semiconductor Device]

First, power amplifier semiconductor device 100 according to Embodiment 1 will be described with reference to FIG. 1. FIG. 1 is a diagram illustrating the configuration of power amplifier semiconductor device 100 according to Embodiment 1. (a) in FIG. 1 illustrates a plan view of power amplifier semiconductor device 100. (b) in FIG. 1 illustrates a cross-sectional view of power amplifier semiconductor device 100 according to Embodiment 1 taken at cutting line 1b-1b in (a) in FIG. 1. (c) in FIG. 1 illustrates a cross-sectional view of power amplifier semiconductor device 100 according to Embodiment 1 taken at cutting line 1c-1c in (a) in FIG. 1. Power amplifier semiconductor device 100 is a semiconductor device (semiconductor chip) which operates at a high frequency and in which a plurality of unit high electron mobility transistors (HEMTs) are connected in parallel. A high frequency means, for example, a frequency of 3 GHz or higher, but is not limited to this example. A high frequency is an electric wave and includes, for example, a millimeter wave and an electromagnetic wave. A unit HEMT includes source electrode 301 (finger electrode), drain electrode 302 (finger electrode), and gate electrode 303 (finger electrode), one for each.

As illustrated in (a) through (c) in FIG. 1, power amplifier semiconductor device 100 includes substrate 101, semiconductor epitaxial layer 102, first insulating layer 201, second insulating layer 202, third insulating layer 203, fourth insulating layer 204, fifth insulating layer 205, source electrodes 301, drain electrodes 302, gate electrodes 303, field plate electrodes 304, active region 401, non-active region 402, first wiring layer 501, second wiring layer 502, shield wiring layer 503, electrode-wire opening connectors 601, wire-wire opening connectors 602, via-wire opening connectors 603, source aggregation portion 701, drain aggregation portion 702, gate aggregation portion 703, source bump opening 801, drain bump opening 802, gate bump opening 803, shield bump opening 804, substrate vias 901, semiconductor layer vias 902, and back electrode 103.

In the present embodiment, connection layer L1 including source electrode 301, drain electrode 302, and gate electrode 303 that are included in a unit HEMT is formed by a metal layer formed in first insulating layer 201, second insulating layer 202, third insulating layer 203, and fourth insulating layer 204 provided above semiconductor epitaxial layer 102. In the present embodiment, terminal layer L2 including source pad 701a, drain pad 702a, and gate pad 703a, each of which is respectively connected to source electrodes 301, drain electrodes 302, and gate electrodes 303, is formed by a metal layer formed in fifth insulating layer 205 provided on connection layer L1.

Substrate 101 comprises, for example, Si. Semiconductor epitaxial layer 102 is formed on the first main surface (top surface) of substrate 101, and back electrode 103 is formed on a second main surface (bottom surface) opposite the side on which the first main surface is located. Substrate 101 is not limited to a substrate comprising Si, and may be a substrate comprising sapphire, SiC, GaN, AlN, or the like.

Semiconductor epitaxial layer 102 is formed on the surface of substrate 101 and is a layer for forming unit HEMTs. It can be said that semiconductor epitaxial layer 102 is a layer including unit HEMTs. Semiconductor epitaxial layer 102 is one example of a semiconductor layer.

Semiconductor epitaxial layer 102 is a nitride semiconductor layer having a stacked structure including a plurality of layers such as an AlN layer and an AlGaN layer each with a thickness of, for example, 2 μm. Semiconductor epitaxial layer 102 includes therein a two-dimensional electron gas layer (not shown in the figure) serving as a carrier in the transistor. Carrier formation in the transistor may be performed by doping using ion implantation or conditions for epitaxial layer formation. Semiconductor epitaxial layer 102 may include other semiconductor materials such as GaN, InGaN, InAlGaN, Si, SiC, GaAs, AlGaAs, InGaAs, InP, and InN.

Back electrode 103 is provided on the bottom surface of substrate 101 and the potential of back electrode 103 is set to the source potential equal to the potential of source electrode 301. Back electrode 103 is an electrode that covers the bottom surface of substrate 101 without patterns (has a planar shape (without patterns) that is substantially uniformly continuous without any gaps), and covers the whole area of the bottom surface, for example. Back electrode 103 may be an alloy including any one of or at least one of, for example, Ti, Al, W, Ta, Cu, Ni, Au, Sn, or Ag. Back electrode 103 may be a single-layer electrode film having a single-layer structure or a multilayer electrode film having a stacked structure in which metal layers are stacked. Setting a potential to a source potential means supplying the source potential to the potential.

First insulating layer 201 is formed on semiconductor epitaxial layer 102. First insulating layer 201 includes, for example, SiN with a thickness of 30 nm. First insulating layer 201 may include at least one of SiN, $SiO_2$, SiON, SiC, C (diamond), AlN, or $Al_2O_3$.

Source electrode 301 and drain electrode 302 are each formed by forming an opening in first insulating layer 201 and are provided to face each other on semiconductor epitaxial layer 102. Source electrode 301 and drain electrode 302 are each, for example, a multilayer electrode film having a stacked structure in which, for example, a Ti film and an Al film are sequentially stacked, but are not limited to this example. Source electrode 301 and drain electrode 302 each may be an alloy including any one of or at least one of, for example, Ti, Al, Ni, Au, Ta, W, Pd, or Cu. Source electrode 301 and drain electrode 302 each may be a single-layer electrode film having a single-layer structure.

Source electrode 301 and drain electrode 302 are electrically ohmic connected to the carrier in the transistor formed in semiconductor epitaxial layer 102.

A plurality of drain electrodes 302 are provided for a unit HEMT.

Gate electrode 303 is provided between source electrode 301 and drain electrode 302 on semiconductor epitaxial layer 102. Gate electrode 303 is a multilayer electrode film having a stacked structure in which, for example, a Ni film and an Au film are sequentially stacked, but is not limited to this example. Gate electrode 303 may be an alloy including any one of or at least one of, for example, Ti, TiN, Ta, TaN, W, Ni, Pd, Au, Al, or Cu. Gate electrode 303 may be a single-layer electrode film having a single-layer structure.

Gate electrode 303 has a function to control current flowing between source electrode 301 and drain electrode 302 depending on a voltage or current applied to gate electrode 303 for a carrier formed in semiconductor epitaxial layer 102. Such gate electrode 303 may be of a Schottky junction type that has openings in first insulating layer 201 or may have a so-called MIS (metal-insulator-semiconductor) structure that does not have openings in first insulating layer 201. A plurality of gate electrodes 303 may be provided for a unit HEMT.

Second insulating layer 202 is provided on source electrodes 301, drain electrodes 302, and gate electrodes 303, and includes, for example, SiN or $SiO_2$ with a thickness of 150 nm. Second insulating layer 202 may include at least one of SiN, $SiO_2$, SiON, SiC, C (diamond), AlN, or $Al_2O_3$.

Field plate electrode 304 is provided: in parallel to the longer-side direction (the Y-axis direction) of gate electrode 303 when viewed in plan view; closer to drain electrode 302 (on the X-axis positive side) than to the edge of gate electrode 303 on the source electrode 301 side in plan view; and on second insulating layer 202. Field plate electrode 304 is a multilayer electrode film having a stacked structure in which, for example, a Ti film and an Al film are sequentially stacked, but is not limited to this example. Field plate electrode 304 may be an alloy including any one of or at least one of, for example, Ti, TiN, Ta, TaN, W, Ni, Pd, Au, Al, or Cu. Field plate electrode 304 may be a single-layer electrode film having a single-layer structure.

Field plate electrode 304 is connected to have the same potential as the potential of source electrode 301 in FIG. 1, but may be connected to have the same potential as the potential of gate electrode 303.

Third insulating layer 203 is provided on field plate electrodes 304 and includes, for example, SiN or $SiO_2$ with a thickness of 300 nm. Third insulating layer 203 may include at least one of SiN, $SiO_2$, SiON, SiC, C (diamond), AlN, or $Al_2O_3$.

First wiring layer 501 is a metal layer connected to each electrode and is provided on third insulating layer 203. First wiring layer 501 is a multilayer electrode film having a stacked structure in which, for example, a Ti film and an Al film are sequentially stacked, but is not limited to this example. First wiring layer 501 may include at least one of Al, Au, Cu, Ti, W, or Ta.

Electrode-wire opening connector 601 results from opening second insulating layer 202 and third insulating layer 203 for connecting source electrode 301 and first wiring layer 501, drain electrode 302 and first wiring layer 501, gate electrode 303 and first wiring layer 501, and field plate electrode 304 and first wiring layer 501.

Fourth insulating layer 204 is provided on first wiring layer 501 and includes, for example, SiN or $SiO_2$ with a thickness of few micrometers (e.g., 1 μm). Fourth insulating layer 204 may include at least one of SiN, $SiO_2$, SION, SiC, C (diamond), AlN, or $Al_2O_3$.

Second wiring layer 502 is provided on fourth insulating layer 204 and is, for example, a multilayer electrode film having a stacked structure in which, for example, a Ti film and an Al film are sequentially stacked, but is not limited to this example. Second wiring layer 502 may include at least one of Al, Au, Cu, Ti, W, or Ta. Second wiring layer 502 may comprise the same metal as first wiring layer 501 or may comprise metal different from the metal in first wiring layer 501.

Wire-wire opening connector 602 results from opening fourth insulating layer 204 for connecting first wiring layer 501 and second wiring layer 502.

Source aggregation portion 701 aggregates the potentials of source electrodes 301 in first wiring layer 501 and second wiring layer 502 via electrode-wire opening connectors 601 and wire-wire opening connectors 602. In source aggregation portion 701, source electrodes 301 are collectively connected by wires. In other words, source aggregation portion 701 is electrically connected to each of source electrodes 301 and can supply the same potential to each of source electrodes 301. In the present embodiment, source aggregation portion 701 aggregates, in active region 401, source electrodes 301 and field plate electrodes 304 by first wiring layer 501 and second wiring layer 502 via electrode-wire opening connectors 601 and wire-wire opening connectors 602.

Source aggregation portion 701 is provided on connection layer L1 and includes source pad 701a connected to each of source electrodes 301, drain electrodes 302, and gate electrodes 303 in a portion of the wiring layer. Source pad 701a is a portion of source aggregation portion 701 which is exposed by source bump opening 801 that is an opening formed in fifth insulating layer 205, and is a part that is electrically connected to a mounting board or semiconductor package outside the chip by a bump metal disposed in source bump opening 801.

Drain aggregation portion 702 aggregates the potentials of drain electrodes 302 in first wiring layer 501 and second wiring layer 502 via electrode-wire opening connectors 601 and wire-wire opening connectors 602. In drain aggregation portion 702, drain electrodes 302 are collectively connected by wires in a portion of the wiring layer. In other words, drain aggregation portion 702 is electrically connected to each of drain electrodes 302 and can supply the same potential to each of drain electrodes 302.

Drain aggregation portion 702 aggregates, in a region, within non-active region 402, that lies along a direction (the Y-axis direction), with respect to source aggregation portion 701, that is parallel to the longer-side direction of gate electrode 303 in active region 401, drain electrodes 302 by first wiring layer 501 and second wiring layer 502 via electrode-wire opening connectors 601 and wire-wire opening connectors 602.

Drain aggregation portion 702 is provided on connection layer L1 and includes drain pad 702a connected to each of source electrodes 301, drain electrodes 302, and gate electrodes 303 in a portion of the wiring layer. Drain pad 702a is a portion of drain aggregation portion 702 which is exposed by drain bump opening 802 that is an opening formed in fifth insulating layer 205, and is a part that is electrically connected to a mounting board or semiconductor package outside the chip by a bump metal disposed in drain bump opening 802.

Gate aggregation portion 703 aggregates the potentials of gate electrodes 303 in first wiring layer 501 and second wiring layer 502 via electrode-wire opening connectors 601 and wire-wire opening connectors 602. In gate aggregation portion 703, gate electrodes 303 are collectively connected by wires in a portion of the wiring layer. In other words, gate aggregation portion 703 is electrically connected to each of gate electrodes 303 and can supply the same potential to each of gate electrodes 303.

Gate aggregation portion 703 aggregates, in a region, within non-active region 402, that lies along the Y-axis direction, with respect to source aggregation portion 701, that is opposite the side on which drain aggregation portion 702 is located, gate electrodes 303 by first wiring layer 501 and second wiring layer 502 via electrode-wire opening connectors 601 and wire-wire opening connectors 602.

Gate aggregation portion 703 is provided on connection layer L1 and includes gate pad 703a connected to each of source electrodes 301, drain electrodes 302, and gate electrodes 303 in a portion of the wiring layer. Gate pad 703a is a portion of gate aggregation portion 703 which is exposed by gate bump opening 803 that is an opening formed in fifth insulating layer 205, and is a part that is electrically connected to a mounting board or semiconductor package outside the chip by a bump metal disposed in gate bump opening 803.

The plan view shape of source aggregation portion 701, drain aggregation portion 702, and gate aggregation portion 703 is rectangular, but is not limited to this example.

Fifth insulating layer 205 is provided on second wiring layer 502 and is, for example, what an organic resin film with a thickness of 6 μm is stacked on SiN with a thickness of 800 nm. Fifth insulating layer 205 may include at least one of SiN, $SiO_2$, SiON, SiC, C (diamond), AlN, or $Al_2O_3$.

The following openings are formed in fifth insulating layer 205: source bump opening 801 formed by opening fifth insulating layer 205 to expose source aggregation portion 701; drain bump opening 802 formed by opening fifth insulating layer 205 to expose drain aggregation portion 702; and gate bump opening 803 formed by opening fifth insulating layer 205 to expose gate aggregation portion 703.

Shield wiring layer 503 functions as a shield (electromagnetic shield) against noise and includes first wiring layer 501 and second wiring layer 502. Shield wiring layer 503 has the same potential as source electrode 301. Shield wiring layer 503 is provided to surround at least one of drain aggregation portion 702 or gate aggregation portion 703 in plan view at the location of a connection layer in the vertical direction (the Z-axis direction) relative to the surface of substrate 101. Moreover, shield wiring layer 503 is provided to surround at least one of drain pad 702a or gate pad 703a in plan view.

Via-wire opening connector 603 opens first insulating layer 201, second insulating layer 202, and third insulating layer 203, and connects first wiring layer 501 to semiconductor layer via 902.

Shield bump opening 804 is a portion formed by opening fifth insulating layer 205 to expose shield wiring layer 503, and is a part that is electrically connected to the ground potential of the mounting board outside the chip by a bump metal disposed in shield bump opening 804.

Substrate vias 901 are disposed to surround at least one of drain aggregation portion 702 or gate aggregation portion 703 (e.g., in four directions) in plan view, and are disposed to surround gate aggregation portion 703 in non-active region 402 in the present embodiment. Substrate via 901 is a through hole formed by opening substrate 101 to reach back electrode 103, and includes, on its inner wall, a shield wiring layer (e.g., at least one of first wiring layer 501 or second wiring layer 502) that is a portion of the wiring layer whose potential is set to the source potential. The plan view shape of substrate via 901 is, for example, rectangular, but is not limited to this example. For example, a plurality of substrate vias 901 are disposed.

As illustrated in (a) in FIG. 1, substrate vias 901 below shield wiring layer 503 are discontinuously disposed. In plan view, the contour of the opening of substrate via 901 includes discontinuous portion 911. Stated differently, substrate vias 901 are not disposed to continuously surround gate aggregation portion 703. For example, substrate vias 901 and discontinuous portions 911 are alternately disposed around gate aggregation portion 703. Discontinuous portion 911 needs to be provided in at least one location.

Semiconductor layer vias 902 are disposed to surround at least one of drain aggregation portion 702 or gate aggregation portion 703 in plan view, are disposed to pass through semiconductor epitaxial layer 102, and include shield wiring layer 503 on their inner walls in the present embodiment. Semiconductor layer via 902 is a through hole formed by opening semiconductor epitaxial layer 102 to reach substrate 101. In the present embodiment, semiconductor layer vias 902 are formed in a loop that surrounds gate aggregation portion 703. For example, a plurality of semiconductor layer vias 902 are disposed.

Power amplifier semiconductor device 100 configured as described above is divided into the following: active region 401 including a two-dimensional electron gas layer formed in semiconductor epitaxial layer 102; and non-active region 402 that is a region not including a two-dimensional electron gas layer.

Active region 401 is a region in which a two-dimensional electron gas layer is present (a region above substrate 101) in plan view. An HEMT (high-frequency amplifier) including at least source electrodes 301, drain electrodes 302, and gate electrodes 303 is formed in active region 401.

Non-active region 402 is a region on substrate 101 outside active region 401 and is a region in which no two-dimensional electron gas layer is present. Non-active region 402 may be formed by, for example, implanting molecules including any one of He, B, H, F, and Fe. Absence of a two-dimensional electron gas layer includes a state in which electrons are substantially absent, in addition to a state in which electrons are completely absent.

[1-2. Advantageous Effects]

As described above, power amplifier semiconductor device 100 according to Embodiment 1 is a power amplifier semiconductor device in which a plurality of unit high electron mobility transistors (HEMTs) are connected in parallel and which operates at the frequency of at least 3 GHZ, and includes: substrate 101; semiconductor epitaxial layer 102 (one example of a semiconductor layer) provided on the surface of substrate 101 and including the plurality of unit HEMTs; connection layer L1 provided on semiconductor epitaxial layer 102 and including source electrode 301, drain electrode 302, and gate electrode 303 of each of the plurality of unit HEMTs; terminal layer L2 provided on connection layer L1 and including source pad 701a, drain pad 702a, and gate pad 703a respectively connected to source electrode 301, drain electrode 302, and gate electrode 303 of each of the plurality of unit HEMTs via a first portion of a wiring layer; back electrode 103 which is provided on the bottom surface of substrate 101 and whose potential is set to a source potential equal to a potential of source electrode 301; and substrate vias 901 that pass through substrate 101 and have shield wiring layer 503 on inner walls of substrate vias 901, where shield wiring layer 503 is a second portion of the wiring layer whose potential is set to the source potential. Each of drain electrode 302 and gate electrode 303 comprises drain electrodes 302 and gate electrodes 303, respectively, corresponding to the plurality of unit HEMTs. Power amplifier semiconductor device 100 further includes: drain aggregation portion 702 in which drain electrodes 302 are collectively connected by wires in a third portion of the wiring layer; and gate aggregation portion 703 in which gate electrodes 303 are collectively connected by wires in a fourth portion of the wiring layer. In a plan view of substrate 101, either one of drain aggregation portion 702 or gate aggregation portion 703 is or both of drain aggregation portion 702 and gate aggregation portion 703 are each surrounded by substrate vias 901.

With this, when substrate vias 901 are disposed to surround gate aggregation portion 703, noise that passes through substrate 101 and is received by gate aggregation portion 703 can be suppressed. When substrate vias 901 are disposed to surround drain aggregation portion 702, noise that passes through substrate 101 and is emitted by drain aggregation portion 702 can be suppressed, and noise transmission to gate aggregation portion 703 or noise emission to external components of power amplifier semiconductor device 100 can be suppressed. Accordingly, power amplifier semiconductor device 100 can suppress an influence caused by a noise signal, compared with a conventional power amplifier semiconductor device.

Power amplifier semiconductor device 100 may further include semiconductor layer vias 902 that pass through semiconductor epitaxial layer 102 and include shield wiring layer 503 on inner walls of semiconductor layer vias 902. In the plan view, either one of drain aggregation portion 702 or gate aggregation portion 703 may be or both of drain aggregation portion 702 and gate aggregation portion 703 may be each surrounded by semiconductor layer vias 902.

With this, when semiconductor layer vias 902 are disposed to surround gate aggregation portion 703, noise that passes through semiconductor epitaxial layer 102 and is received by gate aggregation portion 703 can be suppressed. When semiconductor layer vias 902 are disposed to surround drain aggregation portion 702, noise that passes through semiconductor epitaxial layer 102 and is emitted by drain aggregation portion 702 can be suppressed, and noise transmission to gate aggregation portion 703 or noise emission to external components of power amplifier semiconductor device 100 can be suppressed. Accordingly, power amplifier semiconductor device 100 can suppress an influence caused by a noise signal, compared with a conventional power amplifier semiconductor device.

In the position of connection layer L1 in a direction vertical to the surface of substrate 101: in the plan view, either one of drain aggregation portion 702 or gate aggregation portion 703 may be or both of drain aggregation portion 702 and gate aggregation portion 703 may be each surrounded by shield wiring layer 503.

With this, when shield wiring layer 503 is disposed to surround gate aggregation portion 703, noise that comes from first insulating layer 201, passes through fourth insulating layer 204, and is received by gate aggregation portion 703 can be suppressed. When shield wiring layer 503 is disposed to surround drain aggregation portion 702, noise that comes from first insulating layer 201, passes through fourth insulating layer 204, and is emitted by drain aggregation portion 702 can be suppressed, and noise transmission to gate aggregation portion 703 or noise emission to external components of power amplifier semiconductor device 100 can be suppressed. Accordingly, power amplifier semiconductor device 100 can suppress an influence caused by a noise signal, compared with a conventional power amplifier semiconductor device.

In the plan view, either one of drain pad 702a or gate pad 703a may be or both of drain pad 702a and gate pad 703a may be each surrounded by shield wiring layer 503.

With this, when shield bump openings 804 are disposed to surround gate aggregation portion 703, noise that passes through fifth insulating layer 205 and is received by gate aggregation portion 703 can be suppressed since bump metals disposed in shield bump openings 804 surround gate aggregation portion 703. When shield bump openings 804 are disposed to surround drain aggregation portion 702, noise that passes through fifth insulating layer 205 and is emitted by drain aggregation portion 702 can be suppressed, and noise transmission to gate aggregation portion 703 or noise emission to external components of power amplifier semiconductor device 100 can be suppressed since bump metals disposed in shield bump openings 804 surround drain aggregation portion 702. Accordingly, power amplifier semiconductor device 100 can further suppress an influence caused by a noise signal, compared with a conventional power amplifier semiconductor device.

In the plan view, the contour of an opening of each of substrate vias 901 may include first discontinuous portion 911 (one example of a first discontinuous portion).

With this, since substrate vias 901 below shield wiring layer 503 are disposed discontinuously, falling off of gate aggregation portion 703 and drain aggregation portion 702 from substrate 101 can be prevented when substrate vias 901 surround gate aggregation portion 703 or drain aggregation portion 702.

Variation of Embodiment 1

Figure 2:
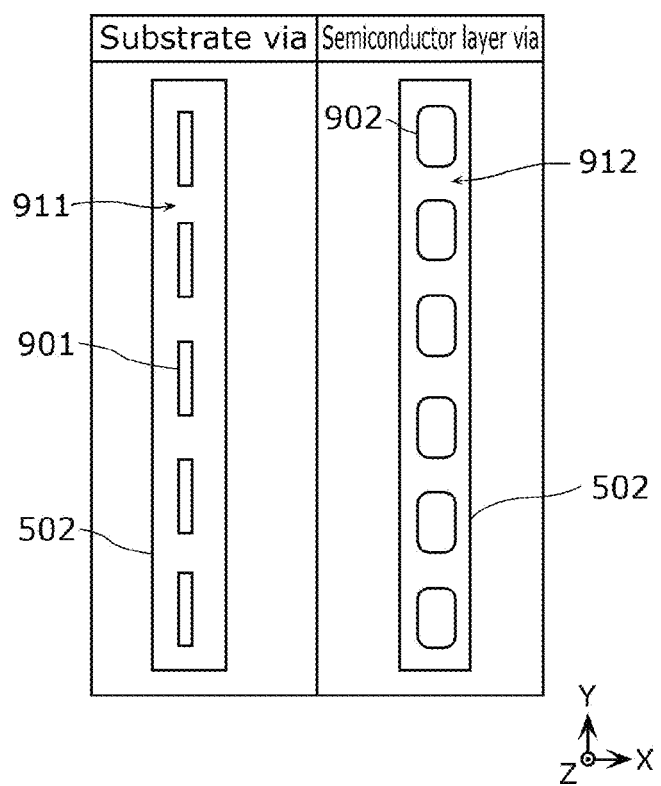
FIG. 2 is a plan view illustrating an arrangement example of substrate vias and semiconductor layer vias in a power amplifier semiconductor device according to a variation of Embodiment 1.

Hereinafter, a power amplifier semiconductor device according to a variation of Embodiment 1 will be described with reference to FIG. 2. FIG. 2 is a plan view illustrating an arrangement example of substrate vias 901 and semiconductor layer vias 902 in the power amplifier semiconductor device according to the variation of Embodiment 1. The following focuses on the difference from Embodiment 1, and a description same as or similar to that in Embodiment 1 will be omitted or simplified. The power amplifier semiconductor device according to the present variation is different from power amplifier semiconductor device 100 according to Embodiment 1 in regard to the arrangement of semiconductor layer vias 902.

As illustrated in FIG. 2, in the power amplifier semiconductor device according to the present variation, semiconductor layer vias 902 below shield wiring layer 503, like substrate vias 901, are disposed discontinuously. In plan view, the contour of the opening of semiconductor layer via 902 has discontinuous portion 912. Stated differently, semiconductor layer vias 902 are not disposed to continuously surround gate aggregation portion 703. For example, an arrangement may be made so that semiconductor layer vias 902 correspond to substrate vias 901 and discontinuous portions 912 correspond to discontinuous portions 911. For example, in plan view, an arrangement may be made so that at least a portion of semiconductor layer via 902 overlaps a portion of substrate via 901 and at least a portion of discontinuous portion 911 overlaps a portion of discontinuous portion 912.

In plan view, the contour of the opening of semiconductor layer via 902 has discontinuous portion 912 (one example of a second discontinuous portion).

With this, falling off of gate aggregation portion 703 and drain aggregation portion 702 from substrate 101 can be prevented. Since shield bump openings 804 are disposed discontinuously, this allows the use of bumps not capable of continuous pattern arrangement achievable by ball bumps.

Embodiment 2

[2-1. Configuration of Power Amplifier Semiconductor Device]

Figure 3:
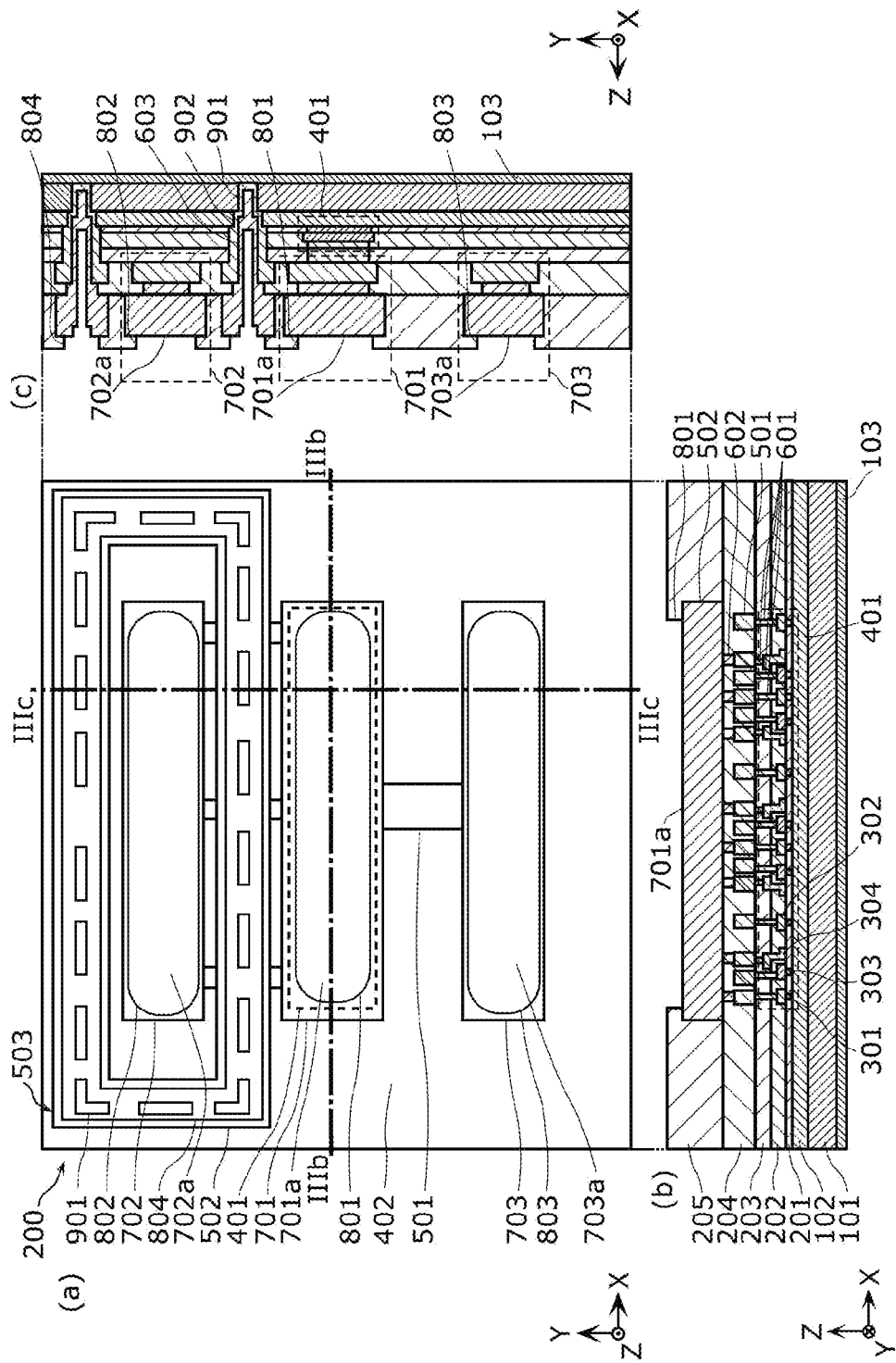
FIG. 3 is a diagram illustrating the configuration of a power amplifier semiconductor device according to Embodiment 2.

Next, power amplifier semiconductor device 200 according to Embodiment 2 will be described with reference to FIG. 3. In the present embodiment, detailed description of elements shared with Embodiment 1 is omitted. FIG. 3 is a diagram illustrating the configuration of power amplifier semiconductor device 200 according to Embodiment 2. (a) in FIG. 3 illustrates a plan view of power amplifier semiconductor device 200. (b) in FIG. 3 illustrates a cross-sectional view of power amplifier semiconductor device 200 according to Embodiment 2 taken at cutting line IIIb-IIIb in (a) in FIG. 3. (c) in FIG. 3 illustrates a cross-sectional view of power amplifier semiconductor device 200 according to Embodiment 2 taken at cutting line IIIc-IIIc in (a) in FIG. 3. Power amplifier semiconductor device 200 is different from power amplifier semiconductor device 100 according to Embodiment 1 in regard to an arrangement in which substrate vias 901 are disposed to surround drain aggregation portion 702.

As illustrated in FIG. 3, power amplifier semiconductor device 200 includes: back electrode 103 formed on the bottom surface of substrate 101; substrate vias 901 formed by opening substrate 101 to reach back electrode 103 and disposed to surround drain aggregation portion 702 in non-active region 402; semiconductor layer vias 902 formed by opening semiconductor epitaxial layer 102 to reach substrate 101; via-wire opening connector 603 that opens first insulating layer 201, second insulating layer 202, and third insulating layer 203, and connects first wiring layer 501 to semiconductor layer via 902; shield wiring layer 503 including first wiring layer 501 and second wiring layer 502; and shield bump opening 804 formed by opening fifth insulating layer 205 to expose shield wiring layer 503.

Thus, substrate vias 901, semiconductor layer vias 902, and shield wiring layer 503 may be each disposed to surround drain aggregation portion 702 in plan view. At least one of (i) substrate vias 901 or (ii) semiconductor layer vias 902 and shield wiring layer 503 needs to be disposed to surround drain aggregation portion 702.

With this, noise that passes through substrate 101 and is received by gate aggregation portion 703 as well as noise that passes through substrate 101 and is emitted by drain aggregation portion 702 can be suppressed.

Embodiment 3

[3-1. Configuration of Power Amplifier Semiconductor Device]

Figure 4:
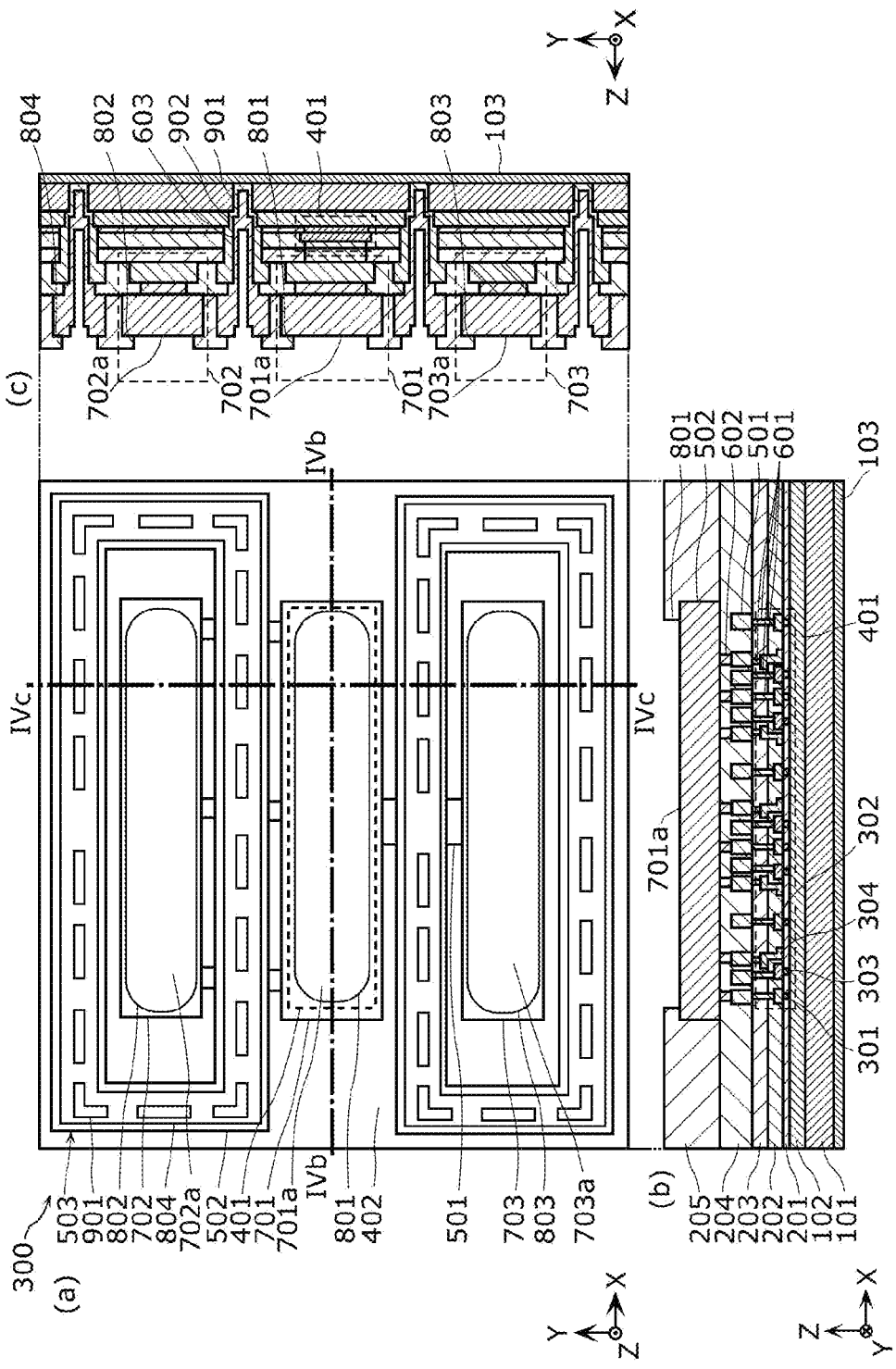
FIG. 4 is a diagram illustrating the configuration of a power amplifier semiconductor device according to Embodiment 3.

Next, power amplifier semiconductor device 300 according to Embodiment 3 will be described with reference to FIG. 4. FIG. 4 is a diagram illustrating the configuration of power amplifier semiconductor device 300 according to Embodiment 3. (a) in FIG. 4 illustrates a plan view of power amplifier semiconductor device 300. (b) in FIG. 4 illustrates a cross-sectional view of power amplifier semiconductor device 300 according to Embodiment 3 taken at cutting line IVb-IVb in (a) in FIG. 4. (c) in FIG. 4 illustrates a cross-sectional view of power amplifier semiconductor device 300 according to Embodiment 3 taken at cutting line IVc-IVc in (a) in FIG. 4. Power amplifier semiconductor device 300 is different from power amplifier semiconductor device 100 according to Embodiment 1 in regard to an arrangement in which substrate vias 901 and others are disposed to surround each of drain aggregation portion 702 and gate aggregation portion 703.

As illustrated in FIG. 4, power amplifier semiconductor device 300 includes: back electrode 103 formed on the bottom surface of substrate 101; substrate vias 901 formed by opening substrate 101 to reach back electrode 103 and disposed to surround gate aggregation portion 703 and drain aggregation portion 702 in non-active region 402; semiconductor layer vias 902 formed by opening semiconductor epitaxial layer 102 to reach substrate 101; via-wire opening connector 603 that opens first insulating layer 201, second insulating layer 202, and third insulating layer 203, and connects first wiring layer 501 to semiconductor layer via 902; shield wiring layer 503 including first wiring layer 501 and second wiring layer 502; and shield bump opening 804 formed by opening fifth insulating layer 205 to expose shield wiring layer 503.

Substrate vias 901, semiconductor layer vias 902, and shield wiring layer 503 may be each disposed to surround each of drain aggregation portion 702 and gate aggregation portion 703. At least one of substrate vias 901, semiconductor layer vias 902, or shield wiring layer 503 needs to be disposed to surround each of drain aggregation portion 702 and gate aggregation portion 703.

[3-2. Advantageous Effects, Etc.]

As described above, in power amplifier semiconductor device 300 according to Embodiment 3, in plan view, drain aggregation portion 702 and gate aggregation portion 703 may be each surrounded by substrate vias 901.

With this, since substrate vias 901 are disposed to surround each of drain aggregation portion 702 and gate aggregation portion 703, it is possible to achieve suppression of noise that passes through substrate 101 and is received by gate aggregation portion 703 as well as suppression of noise emitted from drain aggregation portion 702. The suppression of the noise emission leads to suppression of noise emission to external components of power amplifier semiconductor device 300.

Moreover, in plan view, drain aggregation portion 702 and gate aggregation portion 703 may be each surrounded by semiconductor layer vias 902.

With this, since semiconductor layer vias 902 are disposed to surround each of drain aggregation portion 702 and gate aggregation portion 703, it is possible to achieve suppression of noise that passes through semiconductor epitaxial layer 102 and is received by gate aggregation portion 703 as well as suppression of noise emitted from drain aggregation portion 702.

Moreover, in plan view, drain aggregation portion 702 and gate aggregation portion 703 may be each surrounded by shield wiring layer 503.

With this, since shield wiring layer 503 is disposed to surround gate aggregation portion 703 and drain aggregation portion 702, it is possible to achieve suppression of noise that passes from first insulating layer 201 to fourth insulating layer 204 and is received by gate aggregation portion 703 as well as suppression of noise emitted from drain aggregation portion 702.

Moreover, in plan view, drain pad 702a and gate pad 703a may be each surrounded by shield wiring layer 503.

With this, since shield bump openings 804 are disposed to surround each of gate aggregation portion 703 and drain aggregation portion 702, bump metals disposed in shield bump openings 804 surround each of gate aggregation portion 703 and drain aggregation portion 702. It is therefore possible to achieve suppression of noise that passes through fifth insulating layer 205 and is received by gate aggregation portion 703 as well as suppression of noise emitted from drain aggregation portion 702.

Variation of Embodiment 3

Figure 5:
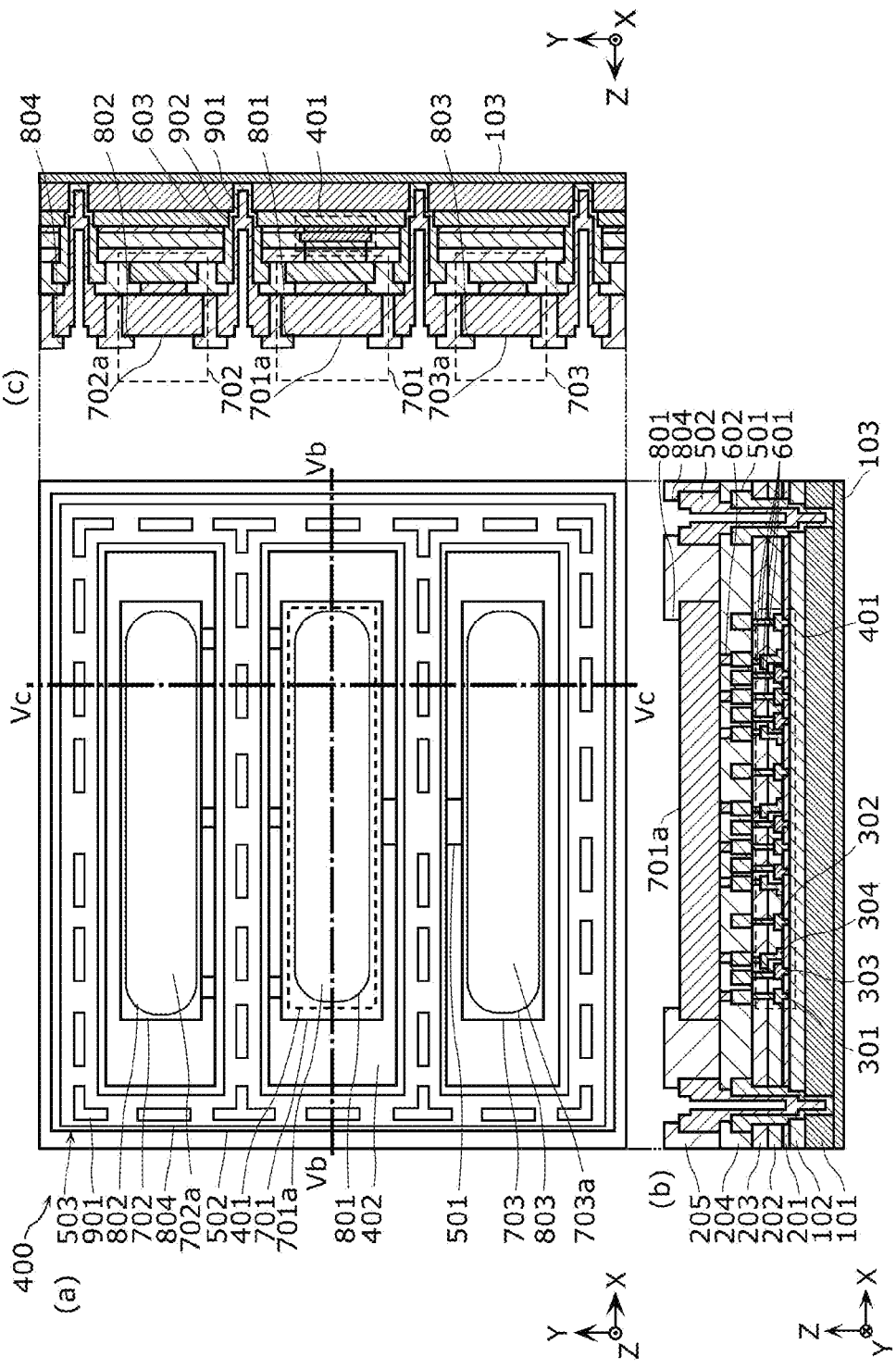
FIG. 5 is a diagram illustrating the configuration of a power amplifier semiconductor device according to a variation of Embodiment 3.

Hereinafter, a power amplifier semiconductor device according to a variation of Embodiment 3 will be described with reference to FIG. 5. FIG. 5 is a diagram illustrating the configuration of power amplifier semiconductor device 400 according to the variation of Embodiment 3. (a) in FIG. 5 illustrates a plan view of power amplifier semiconductor device 400. (b) in FIG. 5 illustrates a cross-sectional view of power amplifier semiconductor device 400 according to the variation of Embodiment 3 taken at cutting line Vb-Vb in (a) in FIG. 5. (c) in FIG. 5 illustrates a cross-sectional view of power amplifier semiconductor device 400 according to the variation of Embodiment 3 taken at cutting line Vc-Vc in (a) in FIG. 5. Power amplifier semiconductor device 400 differs from power amplifier semiconductor device 300 according to Embodiment 3 in that substrate vias 901 and others are disposed to surround source aggregation portion 701 in addition to drain aggregation portion 702 and gate aggregation portion 703.

As illustrated in FIG. 5, substrate vias 901, semiconductor layer vias 902, and shield wiring layer 503 may be disposed to surround each of source aggregation portion 701, drain aggregation portion 702, and gate aggregation portion 703 in plan view.

With this, power amplifier semiconductor device 400 according to the variation of Embodiment 3 produces the same advantageous effects as power amplifier semiconductor device 300 according to Embodiment 3.

Embodiment 4

[4-1. Configuration of Power Amplifier Semiconductor Device]

Figure 6:
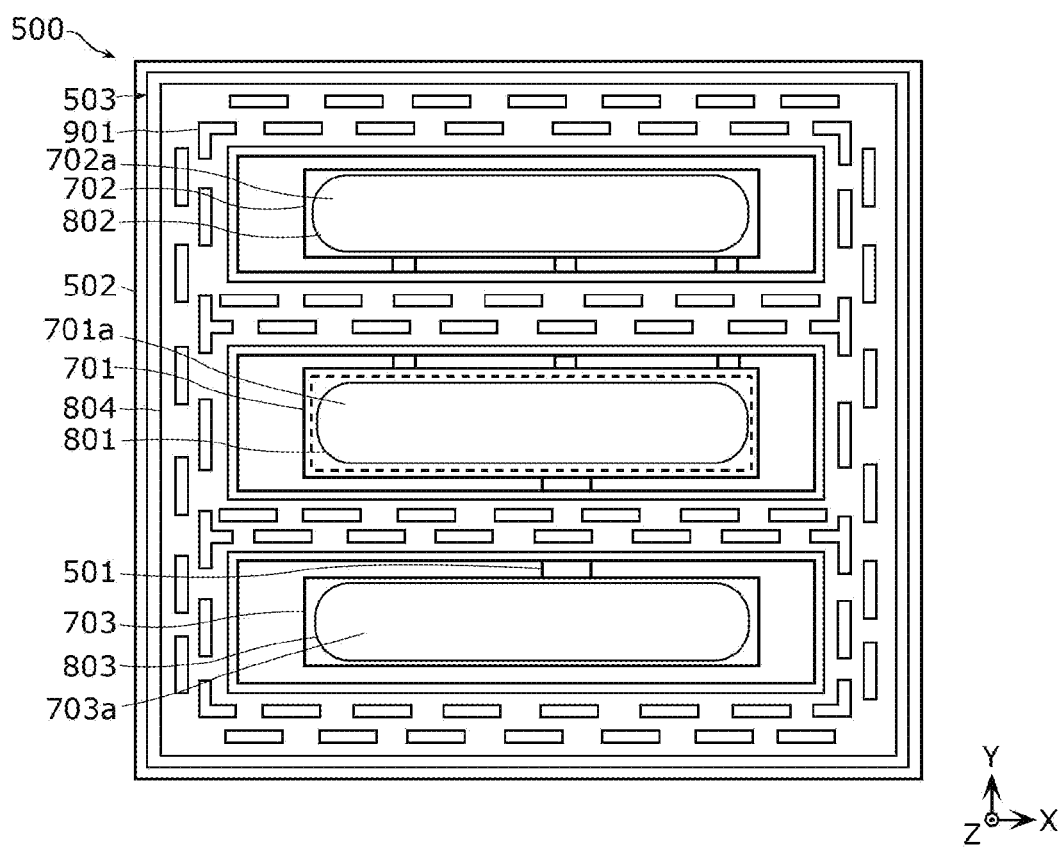
FIG. 6 is a plan view illustrating the configuration of a power amplifier semiconductor device according to Embodiment 4.
Figure 7:
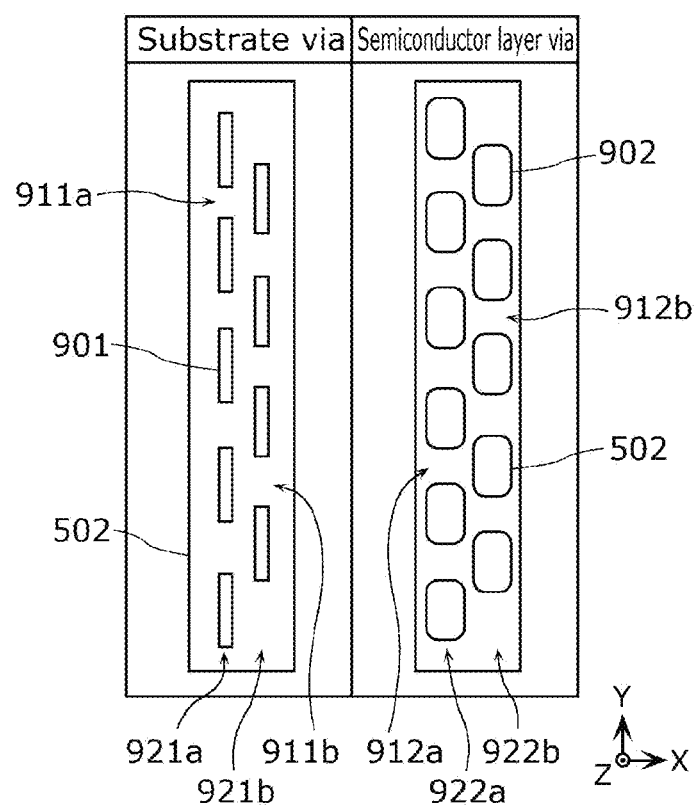
FIG. 7 is a plan view illustrating an arrangement example of substrate vias and semiconductor layer vias in the power amplifier semiconductor device according to Embodiment 4.

Next, a power amplifier semiconductor device according to Embodiment 4 will be described with reference to FIG. 6 and FIG. 7. FIG. 6 is a plan view illustrating the configuration of power amplifier semiconductor device 500 according to Embodiment 4. FIG. 7 is a plan view illustrating an arrangement example of substrate vias 901 and semiconductor layer vias 902 in power amplifier semiconductor device 500 according to Embodiment 4.

Power amplifier semiconductor device 500 differs from power amplifier semiconductor device 400 according to the variation of Embodiment 3 in that substrate vias 901 and semiconductor layer vias 902 are respectively formed in two rows. Although the following describes an arrangement example of substrate vias 901 and semiconductor layer vias 902 according to the present embodiment, using power amplifier semiconductor device 400 according to the variation of Embodiment 3, the arrangement example of substrate vias 901 and semiconductor vias 902 according to the present embodiment is applicable to each of the above embodiments and variations.

As illustrated in FIG. 6, in power amplifier semiconductor device 500, substrate vias 901 are disposed to form two or more substrate via rows in plan view. In the plan view, it can be said that each of source aggregation portion 701, drain aggregation portion 702, and gate aggregation portion 703 surrounded by substrate vias 901 in four directions is an enclosure by a plurality of rows.

As illustrated in FIG. 7, the two or more substrate via rows include first substrate via row 921a and second substrate via row 921b. The number of substrate via rows may be three or more. Semiconductor layer vias 902, like substrate vias 901, are also disposed so that semiconductor layer vias 902 form two or more semiconductor layer via rows in plan view.

First substrate via row 921a and second substrate via row 921b are disposed so that discontinuous portions 911a in first substrate via row 921a do not overlap discontinuous portions 911b in second substrate via row 921b when an inner central position (e.g., the central position of any one of source aggregation portion 701, drain aggregation portion 702, and gate aggregation portion 703) is viewed from the outer position of two or more substrate via rows (e.g., a position on the X-axis negative side). Substrate vias 901 in first substrate via row 921a and substrate vias 901 in second substrate via row 921b are alternately disposed (in zigzag). It can be also said that substrate vias 901 below shield wiring layer 503 are disposed discontinuously as well as alternately in a plurality of rows.

Substrate vias 901 in first substrate via row 921a and substrate vias 901 in second substrate via row 921b are disposed so as to partly overlap each other in the direction in which the via rows are arranged (the X-axis direction in the example in FIG. 7). For example, the length of substrate via 901 in the Y-axis direction may be longer than the length of discontinuous portions 911a and 911b in the Y-axis direction.

First semiconductor layer via row 922a and second semiconductor layer via row 922b are disposed so that discontinuous portions 912a in first substrate via row 922a do not overlap discontinuous portions 912b in second substrate via row 922b when an inner central position (e.g., the central position of any one of source aggregation portion 701, drain aggregation portion 702, and gate aggregation portion 703) is viewed from the outer position of two or more substrate via rows (e.g., a position on the X-axis negative side). Semiconductor layer vias 902 in first substrate via row 922a and semiconductor layer vias 902 in second substrate via row 922b are alternately disposed (in zigzag). It can be also said that semiconductor layer vias 902 are disposed discontinuously as well as alternately in a plurality of rows.

Semiconductor layer vias 902 in first substrate via row 922a and semiconductor layer vias 902 in second substrate via row 922b are disposed so as to partly overlap each other in the direction in which the via rows are arranged (the X-axis direction in the example in FIG. 7). For example, the length of semiconductor layer via 902 in the Y-axis direction may be longer than the length of discontinuous portions 912a and 912b in the Y-axis direction.

For example, shield bump openings 804 may be also disposed discontinuously as well as alternately in a plurality of rows.

[4-2. Advantageous Effects]

As described above, in power amplifier semiconductor device 400 according to Embodiment 4, in plan view, substrate vias 901 are disposed in a plurality of rows to avoid discontinuous portions 911a (an example of a first discontinuous portion) in one row overlapping discontinuous portions 911b (an example of the first discontinuous portion) in another row when the central position of an inside surrounded by substrate vias 901 is viewed from the outer position of substrate vias 901 disposed in the plurality of rows.

With this, since substrate vias 901 below shield wiring layer 503 are disposed discontinuously as well as alternately in a plurality of rows, an effect of inhibiting noise from leaking out or leaking in through gaps between discontinuous substrate vias 901 is produced.

In plan view, either one of drain aggregation portion 702 or gate aggregation portion 703 or both of drain aggregation portion 702 and gate aggregation portion 703 may be each surrounded by semiconductor layer vias 902 disposed in a plurality of rows. Semiconductor layer vias 902 in the plurality of rows may be disposed to avoid discontinuous portions 912*a* (an example of a second discontinuous portion) in one row among the plurality of rows overlapping discontinuous portions 912*b* in another row among the plurality of rows when the central position of an inside surrounded by semiconductor layer vias 902 is viewed from the outer position of semiconductor layer vias 902 disposed in the plurality of rows.

With this, since shield bump openings 804 are disposed discontinuously as well as alternately in a plurality of rows, an effect of inhibiting noise from leaking out or leaking in through gaps between bump metals disposed in discontinuous shield bump openings 804 is produced.

Variation of Embodiment 4

Figure 8A:
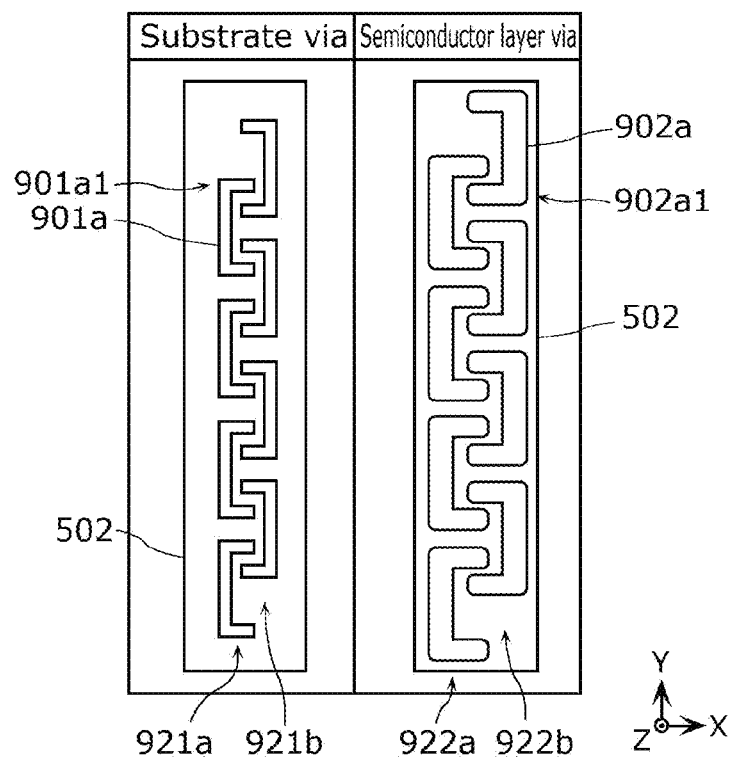
FIG. 8A is a plan view illustrating a first example of an arrangement example of substrate vias and semiconductor layer vias in a power amplifier semiconductor device according to a variation of Embodiment 4.
Figure 8B:
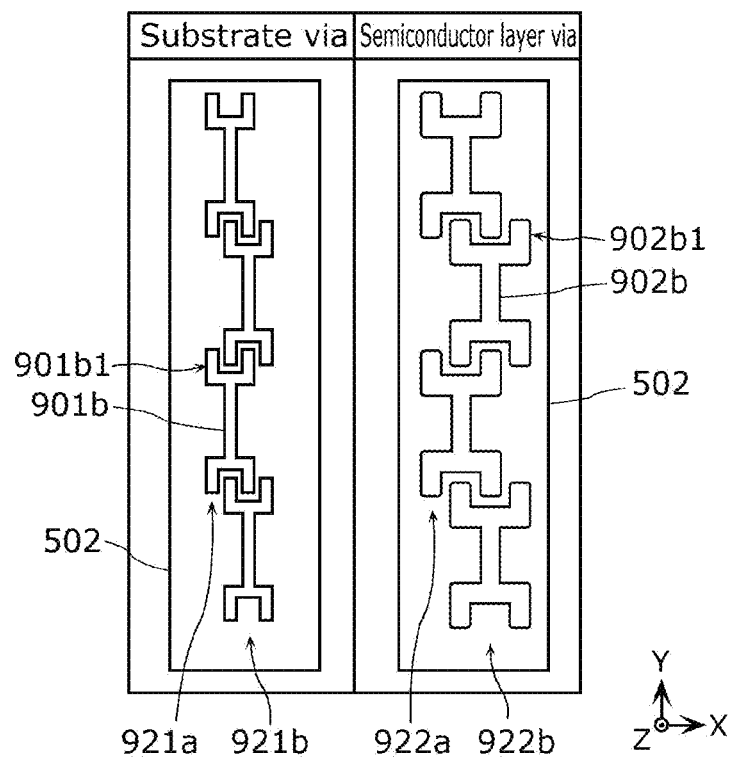
FIG. 8B is a plan view illustrating a second example of an arrangement example of substrate vias and semiconductor layer vias in the power amplifier semiconductor device according to the variation of Embodiment 4.

Next, a power amplifier semiconductor device according to a variation of Embodiment 4 will be described with reference to FIG. 8A and FIG. 8B. FIG. 8A and FIG. 8B are each a plan view illustrating an arrangement example of substrate vias and semiconductor layer vias in the power amplifier semiconductor device according to the variation of Embodiment 4.

As illustrated in FIG. 8A, the plan view shape (the shape of the contour of the opening) of substrate via 901*a* has one or more bent portions 901*a*1 each of which is a portion that is bent. Thus, substrate via 901*a* may be formed by a combination of (i) a portion parallel to a direction in which substrate vias 901*a* included in a substrate via row are aligned (the Y-axis direction in the example in FIG. 8A), and (ii) a portion that is bent toward the alignment direction of substrate vias 901*a*.

Bent portion 901*a*1 is bent toward a direction intersecting (e.g., being orthogonal to) the parallel portion and toward other substrate via row in plan view. For example, bent portion 901*a*1 of substrate via 901*a* included in first substrate via row 921*a* is bent toward second substrate via row 921*b* (on the X-axis positive side in the example in FIG. 8A).

Bent portion 901*a*1 is bent from an end (e.g., both ends) of the parallel portion toward other substrate via row. At least a part of bent portion 901*a*1 of substrate via 901*a* included in first substrate via row 921*a* faces at least a part of bent portion 901*a*1 of substrate via 901*a* included in second substrate via row 921*b*.

The plan view shape of substrate via 901*a* included in first substrate via row 921*a* and the plan view shape of substrate via 901*a* included in second substrate via row 921*b* are, for example, symmetrical with respect to a point.

As illustrated in FIG. 8A, the plan view shape (the shape of the contour of the opening) of semiconductor layer via 902*a*, like the plan view shape of substrate via 901*a*, has one or more bent portions 902*a*1 each of which is a portion that is bent. Thus, semiconductor layer via 902*a* may be formed by a combination of (i) a portion parallel to a direction in which substrate vias 902*a* included in a semiconductor layer via row are aligned (the Y-axis direction in the example in FIG. 8A), and (ii) a portion that is bent toward the alignment direction of semiconductor layer vias 902*a*.

Bent portion 902*a*1 is bent toward a direction intersecting the parallel portion and toward other semiconductor layer via row in plan view. For example, bent portion 902*a*1 of semiconductor layer via 902*a* included in second semiconductor layer via row 922*b* is bent toward second semiconductor layer via row 922*b* (on the X-axis positive side in the example in FIG. 8A).

Bent portion 902*a*1 is bent from an end (e.g., both ends) of the parallel portion toward other semiconductor layer via row. At least a part of bent portion 902*a*1 of semiconductor layer via 902*a* included in first semiconductor layer via row 922*a* faces at least a part of bent portion 902*a*1 of semiconductor layer via 902*a* included in second semiconductor layer via row 922*b*.

The plan view shape of semiconductor layer via 902*a* included in first semiconductor layer via row 922*a* and the plan view shape of semiconductor layer via 902*a* included in second semiconductor layer via row 922*b* are, for example, symmetrical with respect to a point.

Substrate via 901*a* and semiconductor layer via 902*a* have a corresponding shape (a shape having bent portions), and substrate vias 901*a* and semiconductor layer vias 902*a* are disposed to partly overlap each other in plan view.

As illustrated in FIG. 8B, the plan view shape (the shape of the contour of the opening) of substrate via 901*b* has one or more branch portions 901*b*1 each of which is a portion that is branched. Thus, substrate via 901*b* may be formed by a combination of (i) a portion parallel to a direction in which substrate vias 901*b* included in a substrate via row are aligned (the Y-axis direction in the example in FIG. 8B), and (ii) branch portions 901*b*1 that protrude so as to branch from both ends of the parallel portion.

Branch portion 901*b*1 branches from an edge (e.g., both edges) of the parallel portion to form a Y shape in plan view. At least a part of branch portion 901*b*1 of substrate via 901*b* included in first substrate via row 921*a* faces at least a part of branch portion 901*b*1 of substrate via 901*b* included in second substrate via row 921*b*.

As illustrated in FIG. 8B, the plan view shape (the shape of the contour of the opening) of semiconductor layer via 902*b*, like the plan view shape of substrate via 901*b*, has one or more branch portions 902*b*1 each of which is a portion that is branched. Thus, semiconductor layer via 902*b* may be formed by a combination of (i) a portion parallel to a direction in which semiconductor layer vias 902*b* included in a semiconductor layer via row are aligned (the Y-axis direction in the example in FIG. 8A), and (ii) branch portions 902*b*1 that protrude so as to branch from both ends of the parallel portion.

Branch portion 902*b*1 protrudes from an edge (e.g., both edges) of the parallel portion to form a Y shape in plan view. At least a part of branch portion 902*b*1 of semiconductor layer via 902*b* included in first semiconductor layer via row 922*a* faces at least a part of branch portion 902*b*1 of semiconductor layer via 902*b* included in second semiconductor layer via row 922*b*.

As described above, in the power amplifier semiconductor device according to the variation of Embodiment 4, in plan view, the contour of the opening of substrate via 901*a* or 901*b* may include bent portions 901*a*1 or branch portions 901*b*1. In the plan view, the contour of the opening of semiconductor layer via 902*a* or 902*b* may include bent portions 902*a*1 or branch portions 902*b*1.

With this, the combination of bending patterns and the combination of branching patterns can enhance the effect of inhibiting noise from leaking out or leaking in.

Embodiment 5

[5-1. Configuration of Power Amplifier Semiconductor Device]

Figure 9:
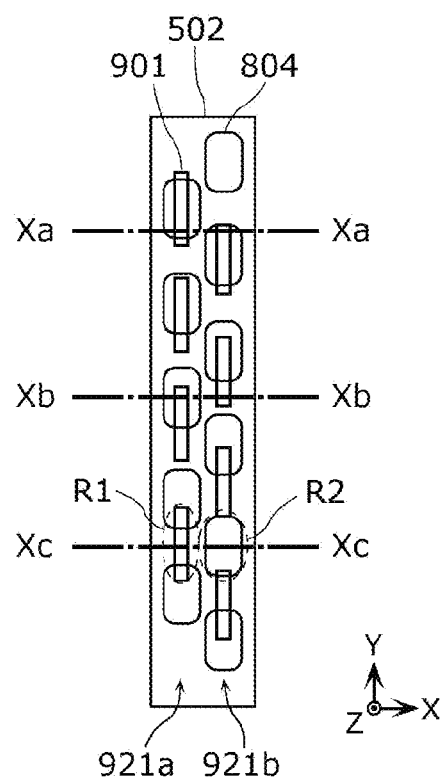
FIG. 9 is a plan view illustrating an arrangement example of substrate vias and bump openings in a power amplifier semiconductor device according to Embodiment 5.

Next, a power amplifier semiconductor device according to Embodiment 5 will be described with reference to FIG. 9 and FIG. 10. FIG. 9 is a plan view illustrating an arrangement example of substrate vias 901 and shield bump openings 804 in the power amplifier semiconductor device according to Embodiment 5.

As illustrated in FIG. 9, in the power amplifier semiconductor device according to Embodiment 5, substrate vias 901 below shield wiring layer 503 (including second wiring layer 502) are disposed discontinuously as well as alternately in a plurality of rows, and shield bump openings 804 are formed discontinuously as well as alternately in a plurality of rows. In addition to the elements in power amplifier semiconductor device 500 according to Embodiment 4, the power amplifier semiconductor device according to Embodiment 5 includes shield bump openings 804 disposed alternately (in zigzag) in first substrate via row 921a and second substrate via row 921b.

The arrangement interval of substrate vias 901 and the arrangement interval of shield bump openings 804 are different between first substrate via row 921a and second substrate via row 921b. Therefore, there are three following types of areas in plan view: an area in which only substrate via 901 is disposed; an area in which only shield bump opening 804 is disposed; and an area in which substrate via 901 and shield bump opening 804 are disposed.

Thus, in a region from terminal layer L2 to substrate 101, shield wiring layer 503 that surrounds either one of aggregation portion 702 or gate aggregation portion 703 or both of drain aggregation portion 702 and gate aggregation portion 703 includes, in the plan view, (i) first region R1 in which shield wiring layer 503 is continuously disposed, and (ii) second region R2 in which shield wiring layer 503 is not continuously disposed.

Figure 10:
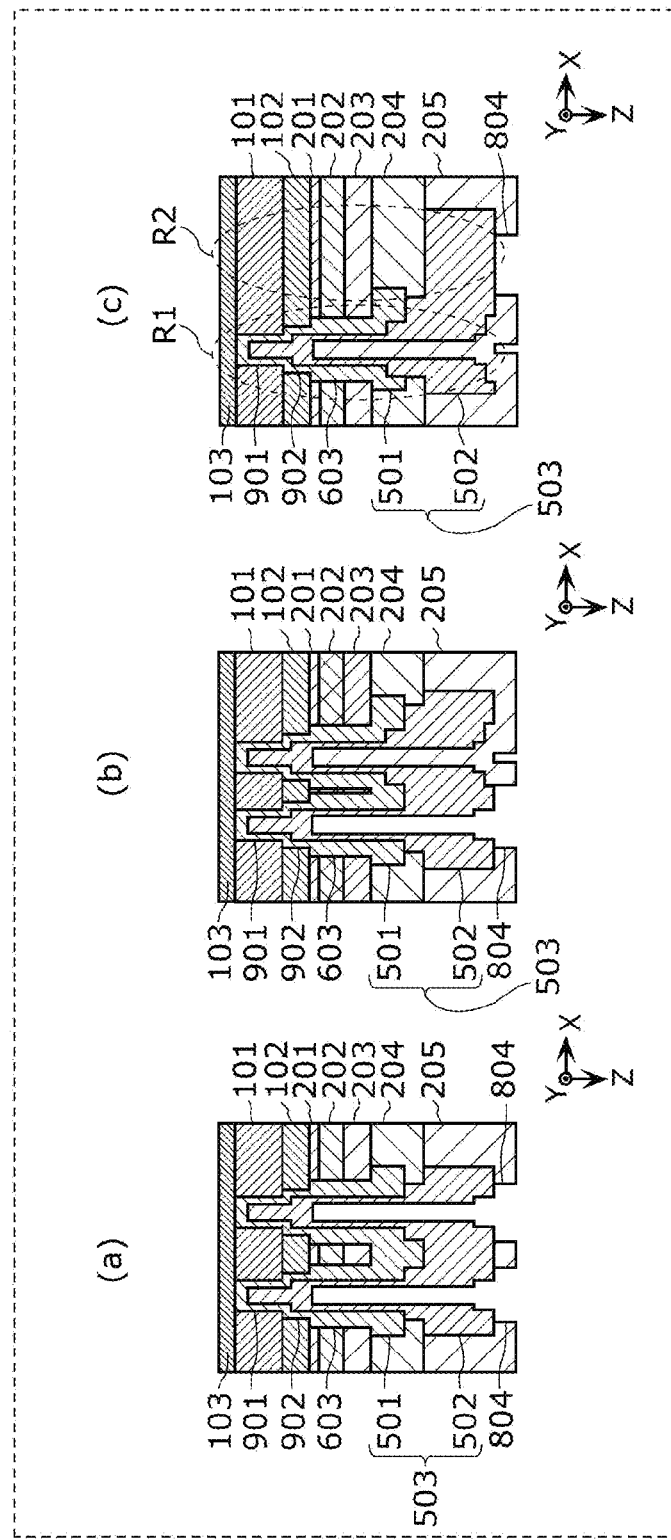
FIG. 10 illustrates cross-sectional views of the power amplifier semiconductor device according to Embodiment 5 taken at cutting lines in FIG. 9.

FIG. 10 is a cross-sectional view of the power amplifier semiconductor device according to Embodiment 5 taken at each of cutting lines in FIG. 9. (a) in FIG. 10 is a cross-sectional view of the power amplifier semiconductor device according to Embodiment 5 taken at cutting line Xa-Xa in FIG. 9. (b) in FIG. 10 is a cross-sectional view of the power amplifier semiconductor device according to Embodiment 5 taken at cutting line Xb-Xb in FIG. 9. (c) in FIG. 10 is a cross-sectional view of the power amplifier semiconductor device according to Embodiment 5 taken at cutting line Xc-Xc in FIG. 9.

In each of two substrate via rows in the position of cutting line Xa-Xa, shield wiring layer 503 (specifically, first wiring layer 501 and second wiring layer 502) is continuously disposed in a region from terminal layer L2 to substrate 101, and also, shield bump opening 804 is formed in each of the two substrate via rows, as illustrated in (a) in FIG. 10.

The expression "continuously disposed" means that a metal layer for suppressing noise is formed across a region from terminal layer L2 to substrate 101. The expression "is not continuously disposed" means that a metal layer for suppressing noise is formed in a portion of the region from terminal layer L2 to substrate 101.

In each of two substrate via rows in the position of cutting line Xb-Xb, shield wiring layer 503 (specifically, first wiring layer 501 and second wiring layer 502) is continuously disposed in a region from terminal layer L2 to substrate 101, and also, shield bump opening 804 is formed in one of the two substrate via rows, as illustrated in (b) in FIG. 10.

In one of two substrate via rows in the position of cutting line Xc-Xc, shield wiring layer 503 (specifically, first wiring layer 501 and second wiring layer 502) is continuously disposed in a region from terminal layer L2 to substrate 101 and shield bump opening 804 is formed in the other of the two substrate via rows (first region R1 in (c) in FIG. 10), and also, shield wiring layer 503 (specifically, second wiring layer 502) is disposed only in the terminal layer (fifth insulating layer 205) in the region from the terminal layer to substrate 101 (second region R2 in (c) in FIG. 10), as illustrated in (c) in FIG. 10. Shield bump opening 804 is formed in second region R2. In other words, shield bump opening 804 is formed in a region in which shield wiring layer 503 is not continuously disposed.

This allows the part of second wiring layer 502 which is exposed from shield bump opening 804 to be a flat face. When a power amplifier semiconductor device is flip-chip mounted on a mounting board using, for instance, solder balls, it is possible to inhibit conduction defects due to lack of solder caused by solder balls being sucked into vias.

It can be said that first region R1 is a region in which substrate via 901 and semiconductor layer via 902 below shield wiring layer 503, and shield bump opening 804 are continuously connected, whereas second region R2 is a region in which substrate via 901, semiconductor layer via 902, and shield bump opening 804 are discontinuous (e.g., not all of substrate via 901, semiconductor layer via 902, and shield bump opening 804 are formed) in cross-sectional view. In the power amplifier semiconductor device according to Embodiment 5, first region R1 and second region R2 are disposed in a mixed manner.

[5-2. Advantageous Effects, Etc.]

As described above, in the power amplifier semiconductor device according to Embodiment 5, in a region from terminal layer L2 to substrate 101, shield wiring layer 503 that surrounds either one of drain aggregation portion 702 or gate aggregation portion 703 or both of drain aggregation portion 702 and gate aggregation portion 703 includes, in plan view: a region (e.g., first region R1) in which shield wiring layer 503 is continuously disposed; and a region (e.g., second region R2) in which shield wiring layer 503 is not continuously disposed.

With this, since (i) a region in which substrate via 901 and semiconductor layer via 902 below shield wiring layer 503, and shield bump opening 804 are continuously connected, and (ii) a discontinuous region are disposed in a mixed manner, an effect of suppressing noise influence caused by shield wiring layer 503, substrate via 901, semiconductor layer via 902, and a bump metal disposed in shield opening portion 804 and an effect of facilitating flexibility adjustment in designing the arrangement of, for instance, vias can be both achieved.

Variation 1 of Embodiment 5

Next, a power amplifier semiconductor device according to Variation 1 of Embodiment 5 will be described with reference to FIG. 11A through FIG. 11D. FIG. 11A through FIG. 11D are each a plan view illustrating an arrangement example of substrate vias and shield bump opening 804 in the power amplifier semiconductor device according to Variation 1 of Embodiment 5.

Figure 11A:
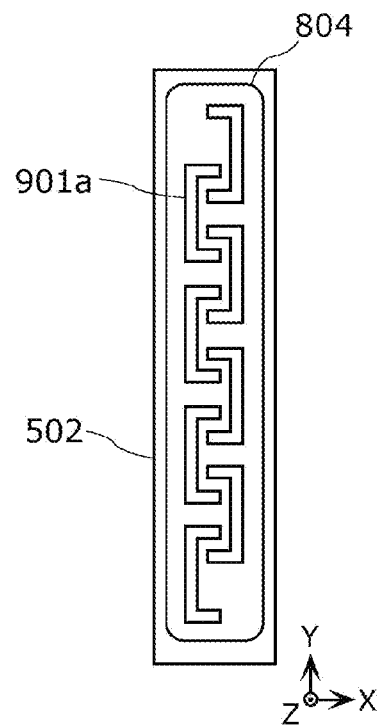
FIG. 11A is a plan view illustrating a first example of an arrangement example of substrate vias and a bump opening in a power amplifier semiconductor device according to Variation 1 of Embodiment 5.

As illustrated in FIG. 11A, shield bump opening 804 may be formed to include substrate vias 901a included in two or more substrate via rows.

Figure 11B:
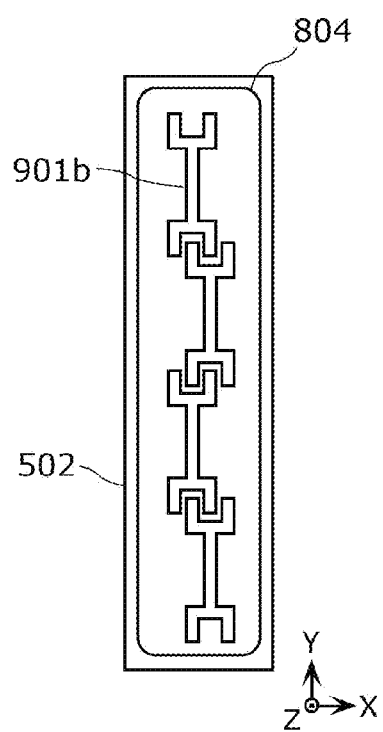
FIG. 11B is a plan view illustrating a second example of the arrangement example of substrate vias and a bump opening in the power amplifier semiconductor device according to Variation 1 of Embodiment 5.

As illustrated in FIG. 11B, shield bump opening 804 may be formed to include substrate vias 901b included in two or more substrate via rows.

Figure 11C:
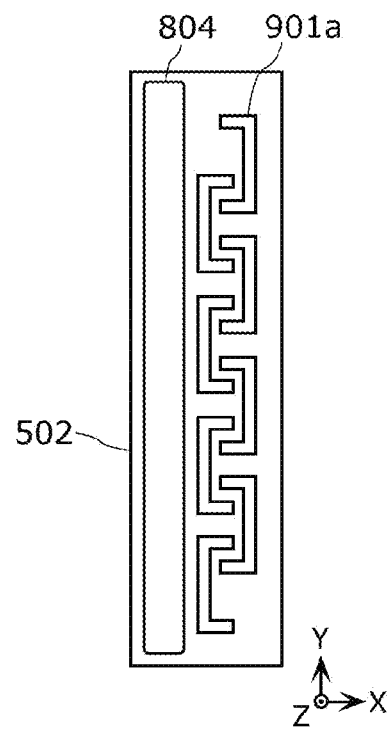
FIG. 11C is a plan view illustrating a third example of the arrangement example of substrate vias and a bump opening in the power amplifier semiconductor device according to Variation 1 of Embodiment 5.

As illustrated in FIG. 11C, shield bump opening 804 may be disposed in alignment with two or more substrate via rows including substrate vias 901a. Shield bump opening 804 may extend in a direction parallel to the extending direction of the substrate via rows (the Y-axis direction in the example in FIG. 11C).

Figure 11D:
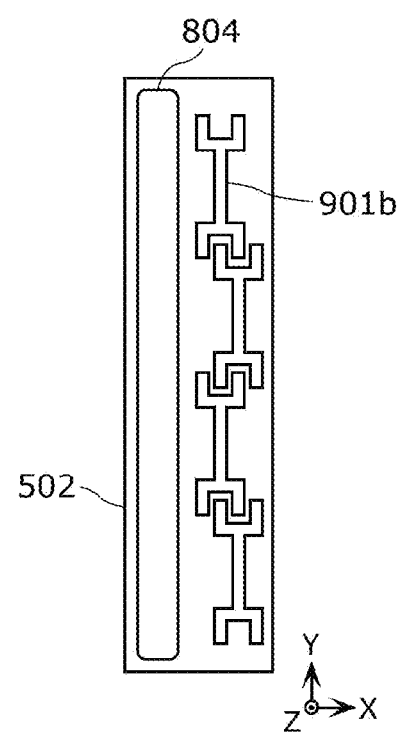
FIG. 11D is a plan view illustrating a fourth example of the arrangement example of substrate vias and a bump opening in the power amplifier semiconductor device according to Variation 1 of Embodiment 5.

As illustrated in FIG. 11D, shield bump opening 804 may be disposed in alignment with two or more substrate via rows including substrate vias 901b. Shield bump opening 804 may extend in a direction parallel to the extending direction of the substrate via rows (the Y-axis direction in the example in FIG. 11D).

The substrate vias and shield bump opening 804 may be disposed to overlap each other in plan view, as illustrated in FIG. 11A and FIG. 11B, or may be disposed not to overlap each other in plan view, as illustrated in FIG. 11C and FIG. 11D. The same advantageous effects as produced by the power amplifier semiconductor device according to Embodiment 5 are produced by such an arrangement of the substrate vias and shield bump opening 804.

Variation 2 of Embodiment 5

Figure 12:
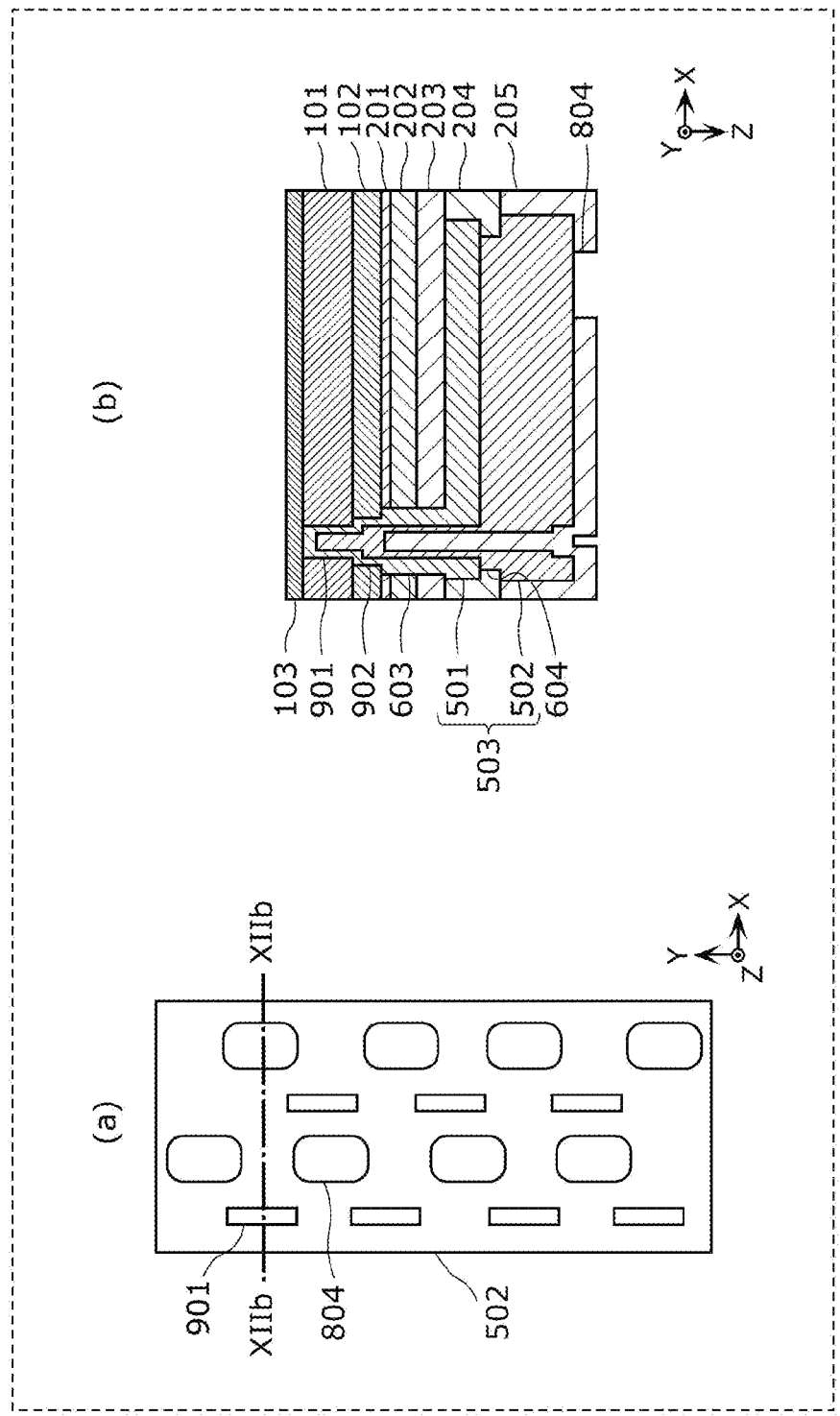
FIG. 12 is a diagram illustrating the configuration of a power amplifier semiconductor device according to Variation 2 of Embodiment 5.

Next, a power amplifier semiconductor device according to Variation 2 of Embodiment 5 will be described with reference to FIG. 12. FIG. 12 is a diagram illustrating the configuration of the power amplifier semiconductor device according to Variation 2 of Embodiment 5. (a) in FIG. 12 is a plan view of an arrangement example of substrate vias 901 and shield bump opening 804 in the power amplifier semiconductor device according to Variation 2 of Embodiment 5. (b) in FIG. 12 is a cross-sectional view of the power amplifier semiconductor device according to Variation 2 of Embodiment 5 taken at cutting line XIIb-XIIb in (a) in FIG. 12.

As illustrated in FIG. 12, in the power amplifier semiconductor device according to Variation 2 of Embodiment 5, shield bump opening 804 is formed not to overlap substrate via 901 and semiconductor layer via 902 below shield wiring layer 503 (first wiring layer 501 and second wiring layer 502) in plan view.

In the power amplifier semiconductor device according to Variation 2 of Embodiment 5, a via row in which substrate via 901 and semiconductor layer via 902 are disposed in alignment and a bump row in which shield bump openings 804 are disposed in alignment are mutually different. One or more via rows and one or more bump rows are disposed, and in the present variation, two via rows and two bump rows are disposed, but the number of via rows and bump rows is not specifically limited. Substrate vias 901 and semiconductor layer vias 902 included in two via rows are disposed alternately (in zigzag) and shield bump openings 804 included in two bump rows are disposed alternately (in zigzag).

When the direction (the X-axis direction in the example in FIG. 12) in which the via rows and the bump rows are aligned is viewed from any position along the Y-axis direction in (a) in FIG. 12, at least one substrate via 901, at least one semiconductor layer via 902, and at least one shield bump opening 804 are disposed.

With this, since shield bump opening 804 is formed not to overlap substrate via 901 and semiconductor layer via 902 below shield wiring layer 503 in plan view, the surface shape of second wiring layer 502 around shield bump opening 804 can be made flat and bump process conditions in a later process can be made simple.

Variation 3 of Embodiment 5

Figure 13:
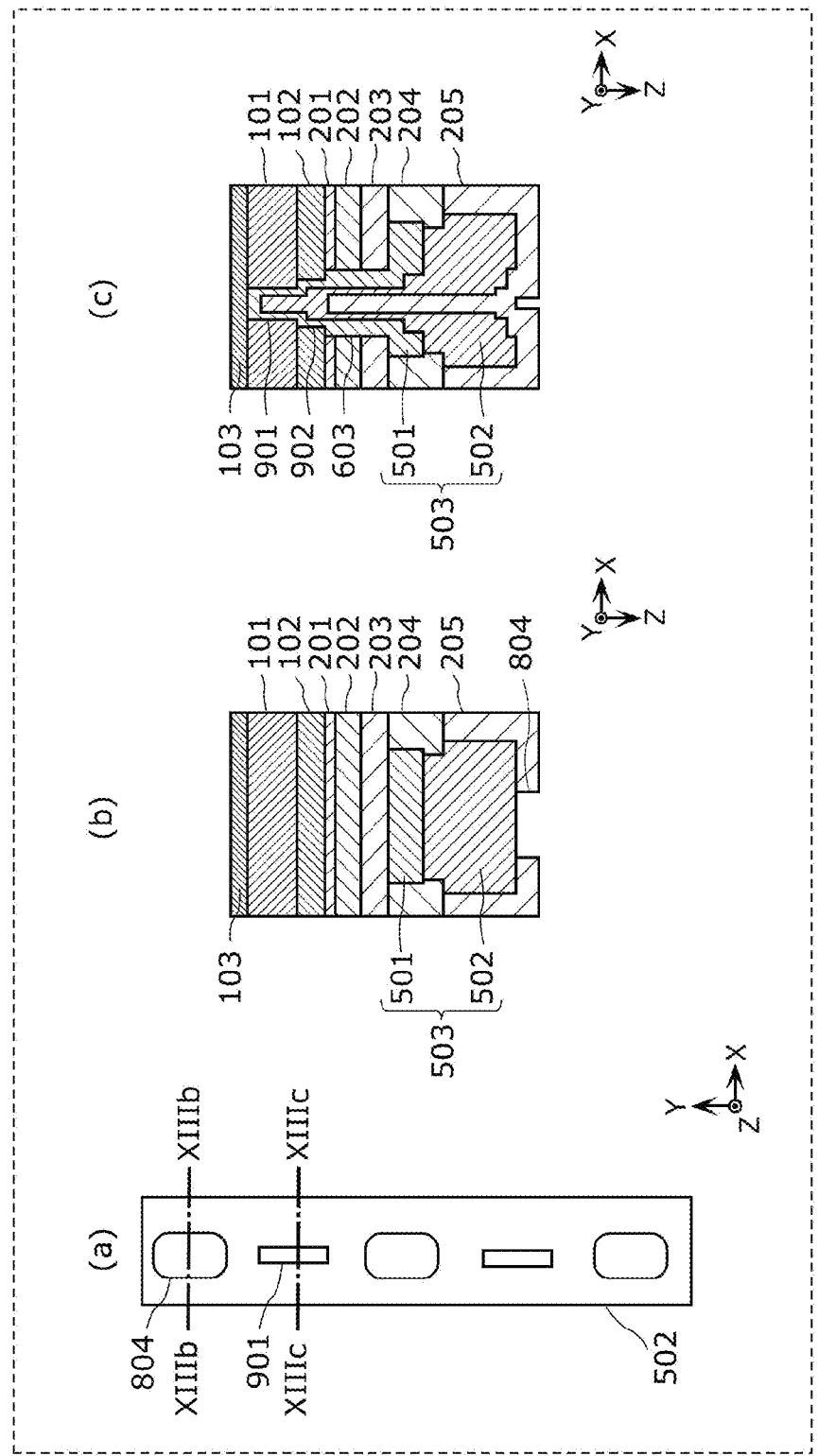
FIG. 13 is a diagram illustrating the configuration of a power amplifier semiconductor device according to Variation 3 of Embodiment 5.

Next, a power amplifier semiconductor device according to Variation 3 of Embodiment 5 will be described with reference to FIG. 13. FIG. 13 is a diagram illustrating the configuration of the power amplifier semiconductor device according to Variation 3 of Embodiment 5. (a) in FIG. 13 is a plan view illustrating an arrangement example of substrate vias 901 and shield bump opening 804 in the power amplifier semiconductor device according to Variation 3 of Embodiment 5. (b) in FIG. 13 is a cross-sectional view of the power amplifier semiconductor device according to Variation 3 of Embodiment 5 taken at cutting line XIIIb-XIIIb in (a) in FIG. 13. (c) in FIG. 13 is a cross-sectional view of the power amplifier semiconductor device according to Variation 3 of Embodiment 5 taken at cutting line XIIIc-XIIIc in (a) in FIG. 13. (b) in FIG. 13 is a cross-sectional view at the position where shield bump opening 804 is disposed and (c) in FIG. 13 is a cross-sectional view at the position where substrate via 901 is disposed.

As illustrated in FIG. 13, substrate vias 901 and shield bump openings 804 may be disposed alternately in a straight line in plan view. In this case, substrate vias 901 and shield bump openings 804 are disposed not to overlap each other in plan view.

With this, even in the configuration in which only one substrate via row is provided, the surface shape of second wiring layer 502 around bump opening portion 804 can be made flat and bump process conditions in a later process can be made simple.

Variation 4 of Embodiment 5

Figure 14:
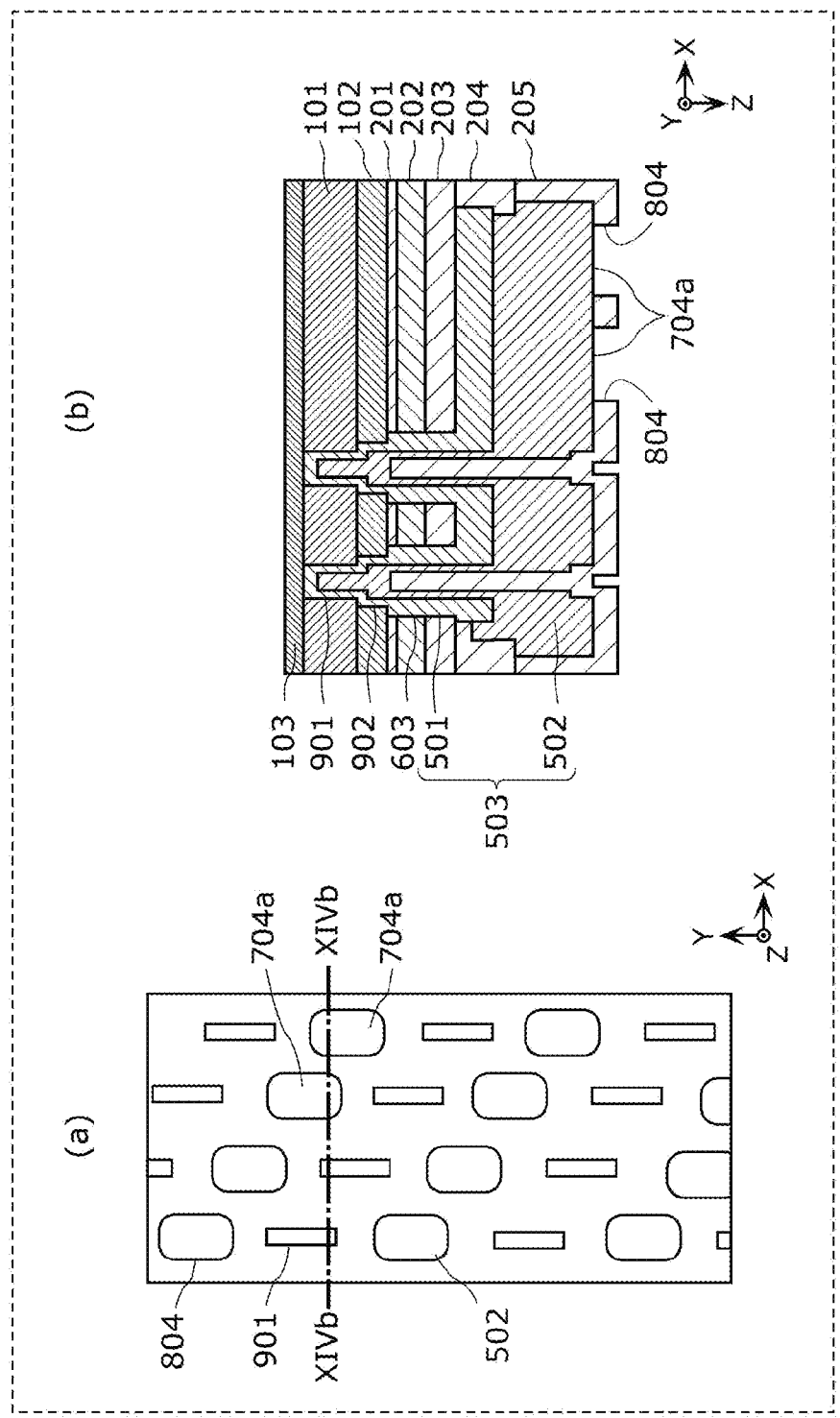
FIG. 14 is a diagram illustrating the configuration of a power amplifier semiconductor device according to Variation 4 of Embodiment 5.

Next, a power amplifier semiconductor device according to Variation 4 of Embodiment 5 will be described with reference to FIG. 14. FIG. 14 is a diagram illustrating the configuration of the power amplifier semiconductor device according to Variation 4 of Embodiment 5. (a) in FIG. 14 is a plan view illustrating an arrangement example of substrate vias 901 and shield bump openings 804 in the power amplifier semiconductor device according to Variation 4 of Embodiment 5. (b) in FIG. 14 is a cross-sectional view of the power amplifier semiconductor device according to Variation 4 of Embodiment 5 taken at cutting line XIVb-XIVb in (a) in FIG. 14.

As illustrated in FIG. 14, the power amplifier semiconductor device according to the present variation includes a plurality of rows in which substrate vias 901 and shield bump openings 804 are disposed alternately in a straight line, in a direction (the X-axis direction in the example in FIG. 14) orthogonal to the extending direction (the Y-axis direction in the example in FIG. 14) of the rows. In this case, substrate vias 901 and shield bump openings 804 are disposed not to overlap each other in plan view.

The power amplifier semiconductor device according to the present variation includes shield pads 704a connected to shield wiring layer 503 (second wiring layer 502). Shield pad 704a is a portion of second wiring layer 502 exposed from shield bump opening 804. Shield pad 704a is provided so that the pad area of shield pad 704a (the area of shield bump opening 804 in (a) in FIG. 14) does not overlap the opening areas of substrate vias 901 (the rectangular areas of substrate vias 901 in (a) in FIG. 14).

As described above, the power amplifier semiconductor device according to Variation 4 of Embodiment 5 includes shield pad 704a connected to shield wiring layer 503. In plan view, the pad area of shield pad 704a does not overlap the opening areas of substrate vias 901. For example, the pad area is disposed in a position that does not overlap the opening areas in plan view.

With this, even in the configuration in which a plurality of rows in each of which substrate vias 901 and shield bump openings 804 are disposed alternately in a straight line are provided, the surface shape of second wiring layer 502 around shield bump opening 804 can be made flat and bump process conditions in a later process can be made simple.

Variation 5 of Embodiment 5

Figure 15:
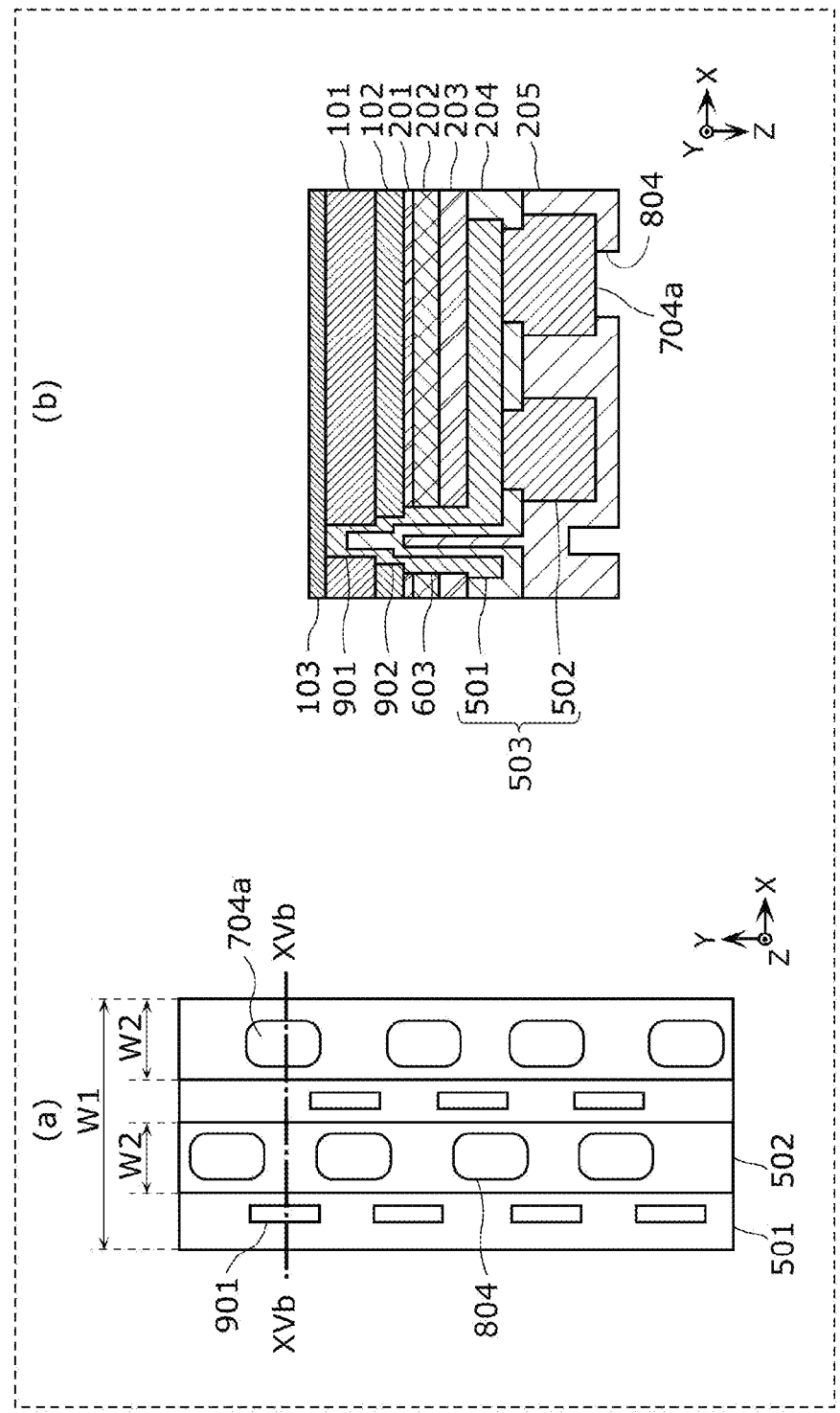
FIG. 15 is a diagram illustrating the configuration of a power amplifier semiconductor device according to Variation 5 of Embodiment 5.

Next, a power amplifier semiconductor device according to Variation 5 of Embodiment 5 will be described with reference to FIG. 15. FIG. 15 is a diagram illustrating the configuration of the power amplifier semiconductor device according to Variation 5 of Embodiment 5. (a) in FIG. 15 is a plan view illustrating an arrangement example of substrate vias 901 and shield bump openings 804 in the power amplifier semiconductor device according to Variation 5 of Embodiment 5. (b) in FIG. 15 is a cross-sectional view of the power amplifier semiconductor device according to Variation 5 of Embodiment 5 taken at cutting line XVb-XVb in (a) in FIG. 15.

When shield wiring layer 503 includes layers such as first wiring layer 501 and second wiring layer 502, as illustrated in FIG. 15, shield wiring layer 503 may be disposed so that the width of second wiring layer 502 that is the upper layer is different from the width of first wiring layer 501 that is the lower layer. For example, shield wiring layer 503 includes a first shield wiring layer (e.g., first wiring layer 501) provided in connection layer L1 and a second shield wiring layer (e.g., second wiring layer 502) provided in terminal layer L2. The first shield wiring layer is connected to the second shield wiring layer in, for example, fourth insulating layer 204.

Second wiring layer 502 is disposed in a part of first wiring layer 501 where neither substrate vias 901 nor semiconductor layer vias 902 are disposed in plan view, i.e., a part of first wiring layer 501 where the surface of first wiring layer 501 on the Z-axis positive side is flat.

In plan view, the width of a line that surrounds either one of drain aggregation portion 702 or gate aggregation portion 703 or both of drain aggregation portion 702 and gate aggregation portion 703 is different between the first shield wiring layer and the second shield wiring layer. Width W1 of wires in the first shield wiring layer is greater than width W2 of wires in the second shield wiring layer.

In the present variation, substrate vias 901, semiconductor layer vias 902, and second wiring layer 502 are disposed not to overlap each other in plan view.

As described above, shield wiring layer 503 in the power amplifier semiconductor device according to Variation 5 of Embodiment 5 may include a first shield wiring layer provided in connection layer L1 and a second shield wiring layer provided in terminal layer L2. In plan view, the width (width W1 or W2) of the first shield wiring layer and the width (width W1 or W2) of the second shield wiring layer may be mutually different in a portion that surrounds either one of drain aggregation portion 702 or gate aggregation portion 703 or both of drain aggregation portion 702 and gate aggregation portion 703.

With this, when shield wiring layer 503 includes layers including first wiring layer 501 and second wiring layer 502, second wiring layer 502 that is the upper layer and first wiring layer 501 that is the lower layer are disposed so that the width of second wiring layer 502 is different from the width of first wiring layer 501. It is therefore possible to enhance flexibility in designing the positional relationship of shield bump opening 804 relative to substrate vias 901 and semiconductor layer vias 902.

Embodiment 6

[6-1. Configuration of Power Amplifier Semiconductor Device]

Figure 16:
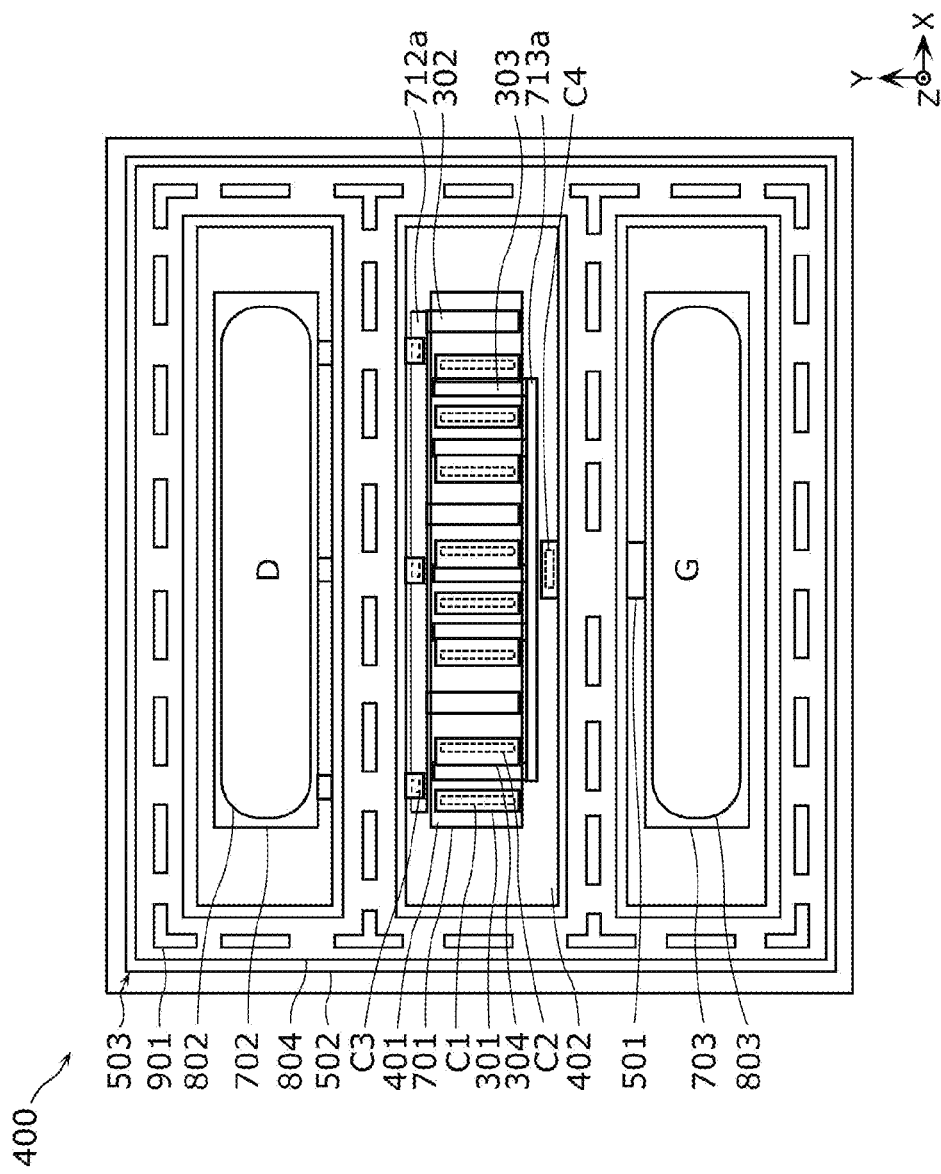
FIG. 16 is a plan view illustrating the configuration of a power amplifier semiconductor device according to Embodiment 6.

Next, a power amplifier semiconductor device according to Embodiment 6 will be described with reference to FIG. 16. FIG. 16 is a plan view illustrating the configuration of power amplifier semiconductor device 400 according to Embodiment 6. FIG. 16 is a plan view, but solid lines indicate finger electrodes such as source electrodes 301, drain electrodes 302, gate electrodes 303, and field plate electrodes 304, as well as busbar electrodes that aggregate the finger electrodes. A connection between each finger electrode and a pad corresponding to the finger electrode will be described with reference to FIG. 16.

As illustrated in FIG. 16, source electrode 301 is connected to source aggregation portion 701 formed at the source pad 701a (e.g., see FIG. 1, for instance) area via connection part C1. Source pad 701a is formed immediately above source electrodes 301. Field plate electrode 304 is also connected to source aggregation portion 701 via connection part C2.

Aggregation electrode portion 712a (busbar electrode) extends in the alignment direction (the X-axis direction) of drain electrodes 302 and is electrically connected to drain electrodes 302. Aggregation electrode portion 712a is connected to drain aggregation portion 702 by aggregation wires (e.g., three aggregation wires) via one or more connection parts C3 in the vicinity of the transistor. Aggregation electrode portion 712a is disposed in the vicinity of the transistor in plan view.

In other words, the connection between drain electrodes 302 and aggregation electrode portion 712a and the position of aggregation electrode portion 712a are in the vicinity of the transistor, and aggregation electrode portion 712a is connected to drain pad 702a (the part "D" in FIG. 16) in the drain pad 702a area.

Aggregation electrode portion 713a extends in the alignment direction of gate electrodes 303 (the X-axis direction) and is electrically connected to gate electrodes 303. Aggregation electrode portion 713a aggregates gate electrodes 303 and is connected to gate aggregation portion 703 via one or more connection parts C4 in the vicinity of the transistor. Aggregation electrode portion 713a is disposed in the vicinity of the transistor in plan view. Aggregation electrode portion 713a is connected to gate aggregation portion 703 by an aggregation wire (e.g., a single aggregation wire).

In other words, the connection between gate electrodes 303 and aggregation electrode portion 713a and the position of aggregation electrode portion 713a are in the vicinity of the transistor, and aggregation electrode portion 713a is connected to the gate pad 703a (the part "G" in FIG. 16) in the gate pad 703a area.

Variation of Embodiment 6

Figure 17:
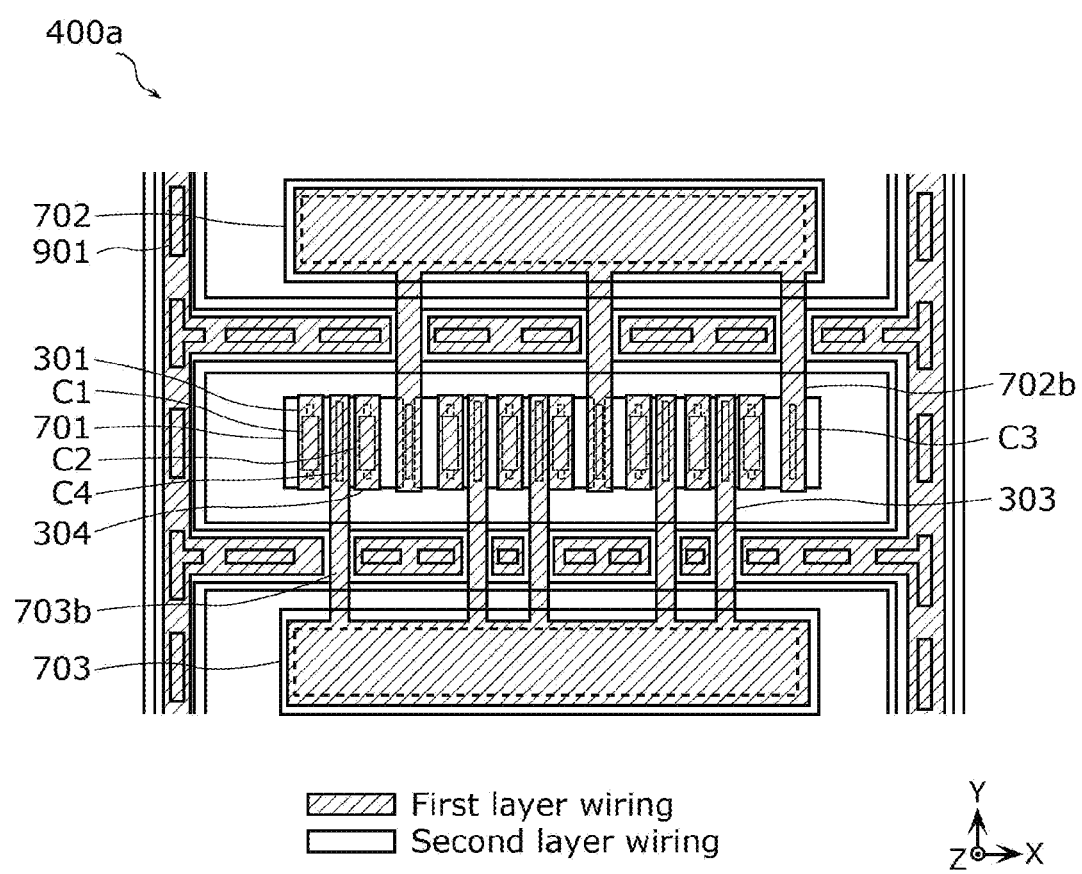
FIG. 17 is a diagram illustrating a first example of the configuration of a power amplifier semiconductor device according to a variation of Embodiment 6.
Figure 18:
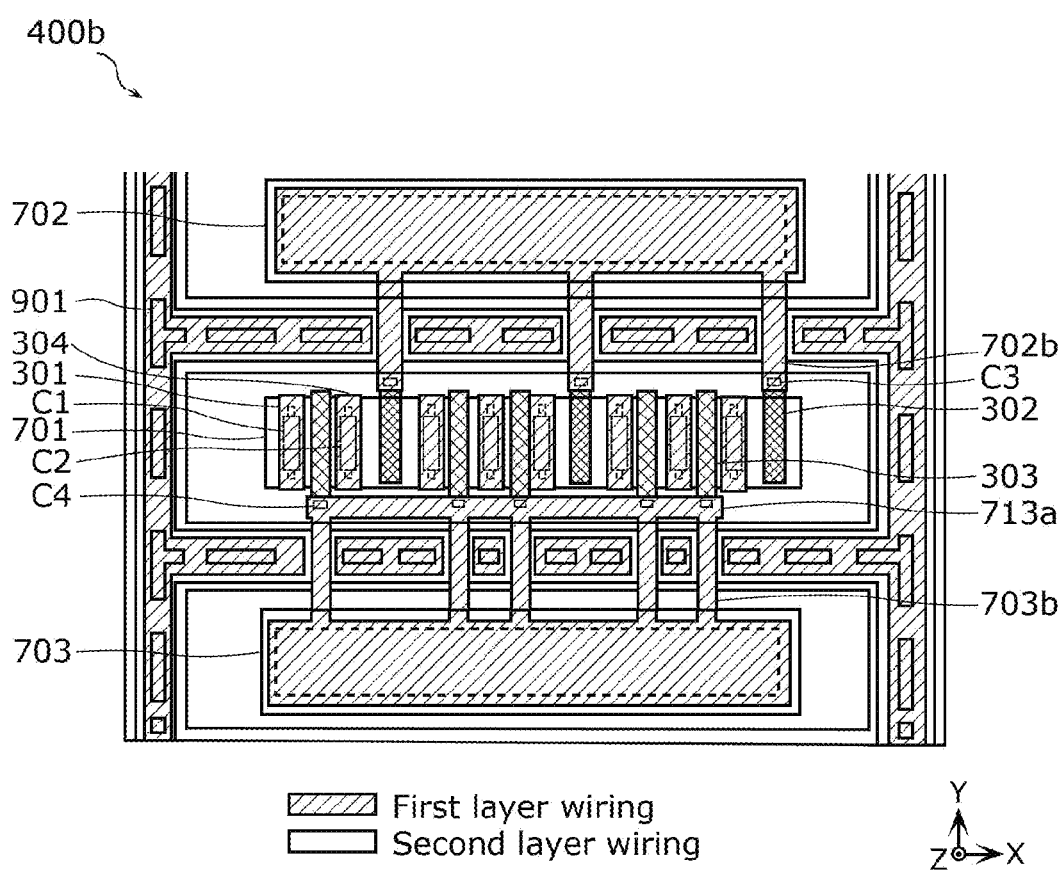
FIG. 18 is a plan view illustrating a second example of the configuration of the power amplifier semiconductor device according to the variation of Embodiment 6.
Figure 19:
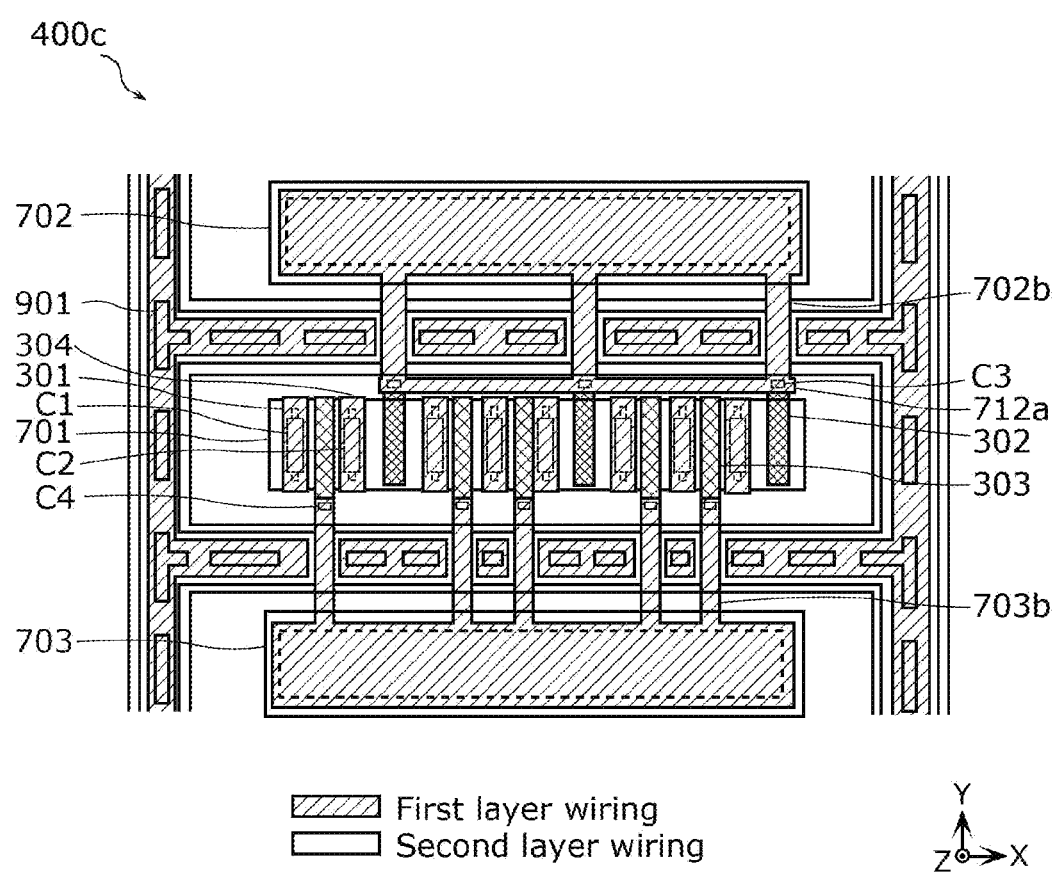
FIG. 19 is a plan view illustrating a third example of the configuration of the power amplifier semiconductor device according to the variation of Embodiment 6.

Next, other examples of the connection between each finger electrode and a pad corresponding to the finger electrode in a power amplifier semiconductor device according to variations of Embodiment 6 will be described with reference to FIG. 17 through FIG. 19. FIG. 17 through FIG. 19 are each a plan view illustrating an example of the configuration of the power amplifier semiconductor device according to a variation of Embodiment 6. In FIG. 17, a first layer wiring (e.g., corresponding to second wiring layer 502 in, for instance, FIG. 16) is shown with diagonal lines and a second layer wiring (e.g., corresponding to first wiring layer 501 in, for instance, FIG. 16) is shown without diagonal lines. Since the connection of source electrodes 301 is the same as that described in Embodiment 6, description is omitted.

As illustrated in FIG. 17, in power amplifier semiconductor device 400a, connection part C3 is disposed in the source pad 701a (e.g., see FIG. 1, for instance) area, and drain electrode 302 is connected to aggregation wire 702b immediately above drain electrode 302 via connection part C3. Drain electrodes 302 are aggregated in the drain pad 702a (e.g., see FIG. 1, for instance) area via aggregation wires 702b.

In power amplifier semiconductor device 400a, connection part C4 is disposed in the source pad 701a area, and gate electrode 303 is connected to the aggregation wire 703b immediately above gate electrode 303 via connection part C4. Gate electrodes 303 are aggregated in the gate pad 703a (e.g., see FIG. 1, for instance) area via aggregation wires 703b.

FIG. 18 is a plan view illustrating the configuration of power amplifier semiconductor device 400b according to a variation of Embodiment 6.

As illustrated in FIG. 18, in power amplifier semiconductor device 400b, connection part C3 is disposed in the vicinity of the transistor, and drain electrode 302 is connected to aggregation wire 702b in the vicinity of the transistor. Drain electrodes 302 are aggregated in the drain pad 702a area (drain aggregation portion 702) via aggregation wires 702b.

In power amplifier semiconductor device 400b, connection part C4 is disposed in aggregation electrode portion 713a that extends in the alignment direction (the X-axis direction) of gate electrodes 303 and that is electrically connected to gate electrodes 303, and gate electrodes 303 are connected to aggregation electrode portion 713a in the vicinity of the transistor. Gate electrodes 303 are aggregated in aggregation electrode portion 713a (i.e., in the vicinity of the transistor) via connection parts C4. Aggregation electrode portion 713a is connected to gate aggregation portion 703 via aggregation wires 703b.

FIG. 19 is a plan view illustrating the configuration of power amplifier semiconductor device 400c according to a variation of Embodiment 6.

As illustrated in FIG. 19, the connection between drain electrodes 302 and drain pad 702a (e.g., see FIG. 1, for instance) is the same as that in power amplifier semiconductor device 400 in FIG. 16, and the connection between gate electrodes 303 and gate pad 703a (see FIG. 1, for example) may be the same as that in power amplifier semiconductor device 400b illustrated in FIG. 18.

Thus, there are various methods and combinations thereof for the connection between each finger electrode and a pad corresponding to the finger electrode, and the connection may be determined where necessary.

(Manufacturing Method)

Next, a method of manufacturing the power amplifier semiconductor device will be described with reference to FIG. 20A through FIG. 20D. Hereinafter, one example of the manufacturing method of power amplifier semiconductor device 100 according to Embodiment 1 will be described. FIG. 20A through FIG. 20D are each a cross-sectional view for explaining the manufacturing method of power amplifier semiconductor device 100 according to Embodiment 1. Since the manufacturing method of a power amplifier semiconductor device other than power amplifier semiconductor device 100 according to Embodiment 1 is the same as the manufacturing method of power amplifier semiconductor device 100 according to Embodiment 1, description is omitted.

As illustrated in (a) in FIG. 20A, semiconductor epitaxial layer 102, having a stacked structure with a thickness of few micrometers (e.g., 2 μm) that includes AlN, GaN, and AlGaN and including a two-dimensional electron gas layer near the hetero interface between AlGaN and GaN, crystal grows on substrate 101 that comprises Si, using metal organic chemical vapor deposition (MOCVD). In the formation of active region 401 serving as a transistor formation region to be described later and non-active region 402, non-active region 402 is formed by inactivating two-dimensional electrons in semiconductor epitaxial layer 102 through ion implantation of F and BF2.

Subsequently, first insulating layer 201 that comprises SiN with a thickness of approximately 30 nm formed by chemical vapor deposition (CVD) is formed on semiconductor epitaxial layer 102, and Ti with a thickness of 20 nm and Al with a thickness of 200 nm which result from opening first insulating layer 201 and performing photoresist patterning are sequentially stacked using a vapor deposition method, and after a lift-off patterning process, owing to alloying treatment through heat treatment, source electrodes 301 and drain electrodes 302 that ohmic contact two-dimensional electron gas in semiconductor epitaxial layer 102 are formed in active region 401, as illustrated in (b) in FIG. 20A.

Subsequently, Ni with a thickness of 50 nm and Au with a thickness of 500 nm, which result from opening first insulating layer 201 and performing photoresist patterning, are sequentially stacked using a vapor deposition method and are lift-off patterned, and gate electrode 303 that is Schottky connected to two-dimensional electron gas in semiconductor epitaxial layer 102 is formed between source electrode 301 and drain electrode 302 in active region 401, as illustrated in (c) in FIG. 20A.

Subsequently, second insulating layer 202 that comprises SiN and has a thickness of approximately 150 nm is formed on source electrodes 301, drain electrodes 302, and gate electrodes 303 by CVD, Ti with a thickness of 50 nm and Al with a thickness of 500 nm, which result from performing photoresist patterning to cover gate electrodes 303, are sequentially stacked on the drain side from the source side gate electrode edge of gate electrode 303, using the vapor deposition method, and field plate electrode 304 that has been lift-off patterned is formed, as illustrated in (a) in FIG. 20B.

Subsequently, third insulating layer 203 that comprises SiN and has a thickness of approximately 300 nm is formed by CVD on field plate electrode 304, and electrode-wire opening connector 601 that exposes a portion of source electrode 301, a portion of drain electrode 302, a portion of gate electrode 303, and a portion of field plate electrode 304 is formed, as illustrated in (b) in FIG. 20B. Via-wire opening connector 603 that exposes a portion of semiconductor epitaxial layer 102 is formed in the region of non-active region 402 in which semiconductor layer vias 902 and substrate vias 901 are formed later.

Subsequently, semiconductor layer via 902 that results from opening semiconductor epitaxial layer 102 and exposing substrate 101 is formed inside via-wire opening connector 603 by dry etching, as illustrated in (c) in FIG. 20B.

Subsequently, substrate 101 is dug approximately 150 μm by dry etching inside semiconductor layer via 902 so that substrate via 901 is formed, as illustrated in (a) in FIG. 20C.

Subsequently, Ti with a thickness of approximately 100 nm and Al with a thickness of approximately 2 μm are sequentially stacked using a spattering method, and first wiring layer 501 is formed by photoresist patterning and dry etching, as illustrated in (b) in FIG. 20C.

Subsequently, fourth insulating layer 204 that comprises $SiO_2$ and has a thickness of approximately 1 μm is formed using a CVD method, and after forming wire-wire opening connector 602 that exposes a portion of first wiring layer 501 by dry etching, Ti with a thickness of 100 nm and Al with a thickness of 4 μm are sequentially stacked using a spattering method, and second wiring layer 502 is formed by photoresist patterning, as illustrated in (c) in FIG. 20C. Shield wiring layer 503 including first wiring layer 501 and second wiring layer 502 is formed in a region in which substrate vias 901 and semiconductor layer vias 902 are formed. Source aggregation portion 701, drain aggregation portion 702, and gate aggregation portion 703 are formed from first wiring layer 501 and second wiring layer 502, although not shown in (c) in FIG. 20C.

Subsequently, fifth insulating layer 205 is formed by a CVD method and spin coat, using a photosensitive organic resin film that is represented by SiN and polyimide and has a thickness of approximately 800 nm, and various bump openings that result from opening fifth insulating layer 205 and exposing second wiring layer 502 are formed, as illustrated in (a) in FIG. 20D. Shield bump opening 804 is formed above shield wiring layer 503 (e.g., first wiring layer 501 and second wiring layer 502).

Source bump opening 801 that opens source aggregation portion 701, drain bump opening 802 (see FIG. 1) that opens drain aggregation portion 702, and gate bump opening portion 803 (see FIG. 1) that opens gate aggregation portion 703 are formed.

Subsequently, after grinding and polishing are performed on the bottom surface of substrate 101, back electrode 103 in which Ti, Ni, and Au are stacked is formed, as illustrated in (b) in FIG. 20D. Power amplifier semiconductor device 100 is thus manufactured.

The above has given an example in which dry etching for forming substrate vias 901 and dry etching for forming semiconductor layer vias 902 are performed from the same face side of substrate 101, but such dry etchings may be performed from opposite face sides. For example, dry etching for forming substrate vias 901 may be performed from the Z-axis positive side (the bottom surface side) of substrate 101 whereas dry etching for forming semiconductor layer vias 902 may be performed from the Z-axis negative side (the surface side) of substrate 101. The same applies to deposition of metal materials using, for instance, a spattering method. This allows manufacturing a power amplifier semiconductor device having a configuration in which substrate vias 901 and semiconductor layer vias 902 are provided at positions that do not overlap each other in plan view.

(Description of Noise Suppression by Bump Metals)

Figure 21:
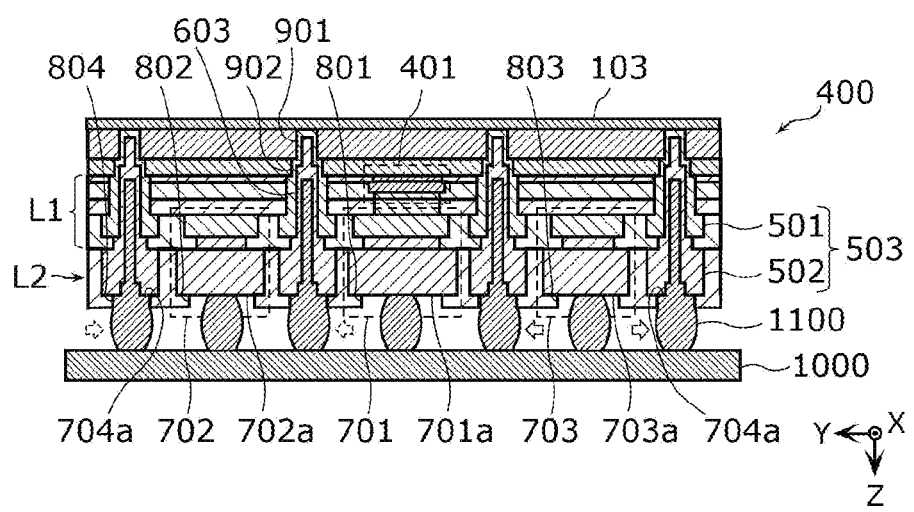
FIG. 21 is a cross-sectional view illustrating a mounting board on which the power amplifier semiconductor device according to each of the embodiments is mounted.

Noise suppression by bump metals will be described with reference to FIG. 21. FIG. 21 is a cross-sectional view illustrating a mounting board on which the power amplifier semiconductor device according to each of the embodiments is mounted. Although FIG. 21 gives an example in which power amplifier semiconductor device 400 according to the variation of Embodiment 3 is mounted on mounting board 1000 via bump metals 1100, the same applies to the power amplifier semiconductor device according to any of other embodiments or variations. In FIG. 21, only noise suppressed by bump metals 1100 is indicated by arrows. Arrows in solid lines indicate noise emitted from drain aggregation portion 702, and arrows in broken lines indicate noise that enter gate aggregation portion 703.

As illustrated in FIG. 21, power amplifier semiconductor device 400 is mounted on, for instance, mounting board 1000 with the face of each pad facing downward (in the Z-axis positive direction), i.e., face-down mounted. The method of mounting power amplifier semiconductor device 400 on mounting board 1000 is not specifically limited and may be, for example, ball grid array (BGA) mounting, land grid array (LGA) mounting, or the like.

Each of source pad 701a, drain pad 702a, gate pad 703a, and shield pad 704a is connected to mounting board 1000 by bump metals 1100. Bump metal 1100 disposed on shield pad 704a may be connected to, for example, a GND pattern on mounting board 1000.

As described above, shield pad 704a is formed to surround each of drain aggregation portion 702 and gate aggregation portion 703 in plan view. Accordingly, bump metal 1100 disposed on shield pad 704a is also disposed to surround each of drain aggregation portion 702 and gate aggregation portion 703 in plan view.

With this, since noise emitted from drain aggregation portion 702 is shielded by bump metals 1100 around drain aggregation portion 702, noise emission to external components of power amplifier semiconductor device 100 can be suppressed. In addition, since noise emitted from the external components or drain aggregation portion 702 is shielded by bump metals 1100 around gate aggregation portion 703, noise from the external components or drain aggregation portion 702 can be suppressed from entering gate aggregation portion 703.

Thus, bump metals 1100 function as shields (electromagnetic shields) against noise.

Other Variations

Although a power amplifier semiconductor device according to one or plural aspects of the present disclosure has been described based on each of the embodiments and others, the present disclosure is not limited to these embodiments. Various modifications to the embodiments which may be conceived by those skilled in the art, as well as other forms resulting from combinations of one or more elements from different embodiments are also included within the scope of the present disclosure so long as they do not depart from the essence of the present disclosure.

For example, each of the embodiments has described an example of a power amplifier semiconductor device including two wiring layers that are a first wiring layer and a second wiring layer, but the present disclosure is not limited to this example and may include a single wiring layer. A single wiring layer is a layer formed in a single process of film formation. In this case, portions of the single wiring layer that are formed in the first insulating layer through the third insulating layer constitute a connection layer, and a portion of the single wiring layer formed in the fourth insulating layer constitutes a terminal layer. The connection layer includes source electrodes, drain electrodes, gate electrodes, and wires that connect these electrodes to electrodes in the terminal layer. Thus, the present disclosure is applicable to a power amplifier semiconductor device including a single wiring layer.

Although each of the embodiments has described an example in which substrate vias and semiconductor layer vias are disposed at positions that overlap each other in plan view, the present disclosure is not limited to this example, and substrate vias and semiconductor layer vias may be disposed at positions that do not overlap each other in plan view.

INDUSTRIAL APPLICABILITY

Since the power amplifier semiconductor device according to the present disclosure excels in suppression of noise generation as well as suppression of an influence caused by external noise, such a power amplifier semiconductor device is useful for a communication amplifier that is likely to generate noise and for which avoidance of an influence caused by external noise is demanded.

The invention claimed is:

1. A power amplifier semiconductor device in which a plurality of unit high electron mobility transistors (HEMTs) are connected in parallel, the power amplifier semiconductor device comprising:
   a substrate;
   a semiconductor layer provided on a surface of the substrate and including the plurality of unit HEMTs;
   a connection layer provided on the semiconductor layer and including a source electrode, a drain electrode, and a gate electrode of each of the plurality of unit HEMTs;
   a terminal layer provided on the connection layer and including a source pad, a drain pad, and a gate pad respectively connected to the source electrode, the drain electrode, and the gate electrode of each of the plurality of unit HEMTs via a first portion of a wiring layer;
   a back electrode which is provided on a bottom surface of the substrate and whose potential is set to a source potential equal to a potential of the source electrode; and
   substrate vias that pass through the substrate and have a shield wiring layer on inner walls of the substrate vias, the shield wiring layer being a second portion of the wiring layer whose potential is set to the source potential, wherein
   each of the drain electrode and the gate electrode comprises drain electrodes and gate electrodes, respectively, corresponding to the plurality of unit HEMTs,
   the power amplifier semiconductor device further comprises:
      a drain aggregation portion in which the drain electrodes are collectively connected by wires in a third portion of the wiring layer; and
      a gate aggregation portion in which the gate electrodes are collectively connected by wires in a fourth portion of the wiring layer, and
   in a plan view of the substrate, either one of the drain aggregation portion or the gate aggregation portion is or both of the drain aggregation portion and the gate aggregation portion are each surrounded by the substrate vias.

2. The power amplifier semiconductor device according to claim 1, further comprising:
   semiconductor layer vias that pass through the semiconductor layer and include the shield wiring layer on inner walls of the semiconductor layer vias, wherein
   in the plan view, either one of the drain aggregation portion or the gate aggregation portion is or both of the drain aggregation portion and the gate aggregation portion are each surrounded by the semiconductor layer vias.

3. The power amplifier semiconductor device according to claim 1, wherein
   in a position of the connection layer in a direction vertical to the surface of the substrate:
      in the plan view, either one of the drain aggregation portion or the gate aggregation portion is or both of the drain aggregation portion and the gate aggregation portion are each surrounded by the shield wiring layer.

4. The power amplifier semiconductor device according to claim 1, wherein
   in the plan view, either one of the drain pad or the gate pad is or both of the drain pad and the gate pad are each surrounded by the shield wiring layer.

5. The power amplifier semiconductor device according to claim 1, wherein
   in the plan view, a contour of an opening of each of the substrate vias includes a first discontinuous portion.

6. The power amplifier semiconductor device according to claim 5, wherein
   in the plan view, either one of the drain aggregation portion or the gate aggregation portion is or both of the drain aggregation portion and the gate aggregation portion are each surrounded by the substrate vias disposed in a plurality of rows, and
   the substrate vias in the plurality of rows are disposed to avoid the first discontinuous portions in one row among the plurality of rows overlapping the first discontinuous portions in another row among the plurality of rows when a central position of an inside surrounded by the substrate vias is viewed from an outer position of the substrate vias disposed in the plurality of rows.

7. The power amplifier semiconductor device according to claim 2, wherein
   in the plan view, a contour of an opening of each of the semiconductor layer vias includes a second discontinuous portion.

8. The power amplifier semiconductor device according to claim 7, wherein
   in the plan view, either one of the drain aggregation portion or the gate aggregation portion is or both of the drain aggregation portion and the gate aggregation portion are each surrounded by the semiconductor layer vias disposed in a plurality of rows, and
   the semiconductor layer vias in the plurality of rows are disposed to avoid the second discontinuous portions in one row among the plurality of rows overlapping the second discontinuous portions in another row among the plurality of rows when a central position of an inside surrounded by the semiconductor layer vias is viewed from an outer position of the semiconductor layer vias disposed in the plurality of rows.

9. The power amplifier semiconductor device according to claim 6, wherein
   in the plan view, the contour of the opening of each of the substrate vias includes bent portions or branch portions.

10. The power amplifier semiconductor device according to claim 8, wherein
    in the plan view, the contour of the opening of each of the semiconductor layer vias includes bent portions or branch portions.

11. The power amplifier semiconductor device according to claim 1, wherein
    in a region from the terminal layer to the substrate, the shield wiring layer that surrounds either one of the drain aggregation portion or the gate aggregation portion or both of the drain aggregation portion and the gate aggregation portion includes, in the plan view, (i) a region in which the shield wiring layer is continuously disposed, and (ii) a region in which the shield wiring layer is not continuously disposed.

12. The power amplifier semiconductor device according to claim 1, further comprising:
a shield pad connected to the shield wiring layer, wherein
in the plan view, a pad area of the shield pad does not overlap opening areas of the substrate vias.

13. The power amplifier semiconductor device according to claim 1, wherein
the shield wiring layer includes: a first shield wiring layer provided in the connection layer and a second shield wiring layer provided in the terminal layer, and
in the plan view, a width of the first shield wiring layer and a width of the second shield wiring layer are mutually different in a portion that surrounds either one of the drain aggregation portion or the gate aggregation portion or both of the drain aggregation portion and the gate aggregation portion.

14. The power amplifier semiconductor device according to claim 1, wherein
in the plan view, the drain aggregation portion and the gate aggregation portion are each surrounded by the substrate vias.

15. The power amplifier semiconductor device according to claim 2, wherein
in the plan view, the drain aggregation portion and the gate aggregation portion are each surrounded by the semiconductor layer vias.

16. The power amplifier semiconductor device according to claim 1, wherein
in the plan view, the drain aggregation portion and the gate aggregation portion are each surrounded by the shield wiring layer.

17. The power amplifier semiconductor device according to claim 1, wherein
in the plan view, the drain pad and the gate pad are each surrounded by the shield wiring layer.

18. The power amplifier semiconductor device according to claim 2, wherein
in a position of the connection layer in a direction vertical to the surface of the substrate:
in the plan view, either one of the drain aggregation portion or the gate aggregation portion is or both of the drain aggregation portion and the gate aggregation portion are each surrounded by the shield wiring layer.

19. The power amplifier semiconductor device according to claim 2, wherein
in the plan view, the drain aggregation portion and the gate aggregation portion are each surrounded by the substrate vias.

20. The power amplifier semiconductor device according to claim 2, wherein
in the plan view, the drain aggregation portion and the gate aggregation portion are each surrounded by the shield wiring layer.

* * * * *